(12) United States Patent
Lin et al.

(10) Patent No.: US 9,015,052 B2
(45) Date of Patent: *Apr. 21, 2015

(54) AUDIO-ENCODING/DECODING METHOD AND SYSTEM OF LATTICE-TYPE VECTOR QUANTIZING

(75) Inventors: Zhibin Lin, Nanjing (CN); Guoming Chen, Shenzhen (CN); Zheng Deng, Nanjing (CN); Hao Yuan, Shenzhen (CN); Jiali Li, Shenzhen (CN); Ke Peng, Shenzhen (CN); Kaiwen Liu, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 287 days.

This patent is subject to a terminal disclaimer.

(21) Appl. No.: 13/499,534

(22) PCT Filed: Oct. 12, 2010

(86) PCT No.: PCT/CN2010/001597
§ 371 (c)(1),
(2), (4) Date: Mar. 30, 2012

(87) PCT Pub. No.: WO2011/063594
PCT Pub. Date: Jun. 3, 2011

(65) Prior Publication Data
US 2012/0259644 A1   Oct. 11, 2012

(30) Foreign Application Priority Data

Nov. 27, 2009 (CN) .......................... 2009 1 0249854

(51) Int. Cl.
*G10L 19/00* (2013.01)
*H03M 7/30* (2006.01)
(Continued)

(52) U.S. Cl.
CPC .......... *H03M 7/3082* (2013.01); *G10L 19/038* (2013.01); *G10L 19/0212* (2013.01);
(Continued)

(58) Field of Classification Search
CPC ... G10L 19/008; G10L 19/038; G10L 19/002; G10L 19/12; G10L 19/24; G10L 19/32; H03M 7/40; H03M 7/70
USPC ........................................................ 704/500
See application file for complete search history.

(56) References Cited

U.S. PATENT DOCUMENTS
6,006,179 A * 12/1999 Wu et al. ........................ 704/222
6,064,954 A *  5/2000 Cohen et al. ................... 704/207
(Continued)

FOREIGN PATENT DOCUMENTS
CN        101110214 A      1/2008
(Continued)

OTHER PUBLICATIONS
Barlaud et al, "A Pyramidal Scheme for Lattice Vector Quantization of Wavelet Transform Coefficients Applied to Image Coding," Mar. 1992, IEEE International Conference on Acoustics, Speech, and Signal Processing, vol. 4, pp. 401-404.*
(Continued)

*Primary Examiner* — James Wozniak
*Assistant Examiner* — Oluwadamilola M. Ogunbiyi
(74) *Attorney, Agent, or Firm* — Banner & Witcoff, Ltd.

(57) ABSTRACT

The audio coding method and system of lattice vector quantization is provided in the invention. The method comprises: dividing frequency domain coefficients of an audio signal for which a modified discrete cosine transform (MDCT) has been performed into a plurality of coding sub-bands, and quantizing and coding an amplitude envelope value of each coding sub-band to obtain coded bits of amplitude envelopes; performing bit allocation on each coding sub-band, and performing normalization, quantization and coding respectively on vectors in a low bit coding sub-band with pyramid lattice vector quantization and on vectors in a high bit coding sub-band with sphere lattice vector quantization to obtain coded bits of the frequency domain coefficients; multiplexing and packing the coded bits of the amplitude envelope and the coded bits of the frequency domain coefficients of each coding sub-band, then sending them to a decoding side.

25 Claims, 6 Drawing Sheets

(51) Int. Cl.
*G10L 19/038* (2013.01)
*G10L 19/02* (2013.01)
*H03M 7/40* (2006.01)

(52) U.S. Cl.
CPC .......... *H03M 7/3059* (2013.01); *H03M 7/3068* (2013.01); *H03M 7/40* (2013.01); *H03M 7/4018* (2013.01); *H03M 7/70* (2013.01)

(56) References Cited

U.S. PATENT DOCUMENTS

| | | | |
|---|---|---|---|
| 6,594,627 | B1 | 7/2003 | Goyal et al. |
| 6,988,067 | B2* | 1/2006 | Kim et al. ................. 704/222 |
| 7,433,824 | B2* | 10/2008 | Mehrotra et al. ............ 704/501 |
| 8,374,853 | B2* | 2/2013 | Ragot et al. ................. 704/220 |
| 2002/0138260 | A1 | 9/2002 | Kim et al. |
| 2004/0176951 | A1* | 9/2004 | Sung et al. ................. 704/222 |
| 2007/0124141 | A1* | 5/2007 | You ........................... 704/230 |
| 2008/0097755 | A1* | 4/2008 | Xie ............................ 704/222 |
| 2009/0234644 | A1* | 9/2009 | Reznik et al. ............... 704/203 |

FOREIGN PATENT DOCUMENTS

| | | |
|---|---|---|
| CN | 101165778 A | 4/2008 |
| CN | 101266795 A | 9/2008 |
| JP | 9107292 A | 4/1997 |

OTHER PUBLICATIONS

Jeong et al, "Uniform and Piecewise Uniform Lattice Vector Quantization for Memoryless Gaussian and Laplacian Sources," May 3, 1993, IEEE Transactions on Information Theory, vol. 39, pp. 786-804.*

Cadel et al, "Pyramid Vector Coding for High Quality Audio Compression," Apr. 1997, IEEE International Conference on Acoustics, Speech, and Signal Processing, vol. 1, pp. 343-346.*

Fischer et al, "Transform Coding of Speech With Pyramid Vector Quantization," Oct. 1985, IEEE Military Communications Conference, vol. 3, pp. 620-623.*

Pan, "Two-Stage Vector Quantization-Pyramidal Lattice Vector Quantization and Application to Speech LSP Coding," May 1996, IEEE International Conference on Acoustics, Speech, and Signal Processing, vol. 2, pp. 737-740.*

Fonteles et al, "Lattice Vector Quantization for Normal Mesh Geometry Coding," May 2006, IEEE International Conference on Acoustics, Speech, and Signal Processing, vol. 2, pp. II 513-II 516.*

Kang et al, "Low-Complexity Predictive Trellis-Coded Quantization of SPeech Line Spectral Frequencies," Jul. 2004, IEEE Transactions on Signal Processing, vol. 52, pp. 2070-2079.*

International Search Report dated Jan. 6, 2011.

"Geometric Source Coding and Vector Quantization" by Thomas R. Fischer, dated Jan. 1989 (8097 IEEE Transactions on Information Theory, New York), pp. 137-145.

"Series G: Transmission Systems and Media, Digital Systems and Networks, Digital Terminal Equipment coding of analogue signals", International Telecommunication Union, Jun. 2008, pp. 1-52.

* cited by examiner

US 9,015,052 B2

AUDIO-ENCODING/DECODING METHOD AND SYSTEM OF LATTICE-TYPE VECTOR QUANTIZING

TECHNICAL FIELD

The present invention relates to audio coding and decoding technology, and in particular, to an audio coding and decoding method and system of lattice-type vector quantizing.

BACKGROUND OF THE RELATED ART

The audio coding and decoding technology is the core of multimedia application technologies such as digital audio broadcast, music transmission and audio telecommunication in the internet and so on, which will greatly benefit from the improvement of the pressing performance of audio encoders. A perceptual audio encoder, one kind of lossy transform domain coding, is a main modern audio encoder. The existing codec, such as Motion Picture Experts Group (MPEG) 4 Advanced Audio Coding (AAC) and so on, performs transform-domain audio coding and decoding in a non-uniform scalar quantization way, for which the calculation has a high complexity, and the compressing ability is not high. The convention statistical vector quantizer (for example, the vector quantizer designed with LBG algorithm, wherein, the LBG is a vector quantization method provided by Linde, Buzo and Gray) has a strong compressing ability, and therefore has been widely used in audio and video compressing field. However, the calculation complexity of a vector quantizer increases exponentially with the dimension, and the code book obtained by training the training sequence with a clustering algorithm is usually not the global optimal. Recently, a new audio coding and decoding vector quantizer i.e. lattice vector quantization arises, which quantizes signals with lattice points in space grid being the vector quantizer. Since the space lattice points are regular, the code book can be constructed by algebra method and only occupies little storage space, and the lattice vector quantization has the advantages of low calculation complexity and high quantization precision. However, since the existing lattice vector quantization based audio codec (such as G.719 and so on) adopts a sphere grid with respect to the coding and decoding code book, the code book truncation is only applicable to information sources of uniform allocation and Gaussian allocation, and has not a good effect for the voice which is an information source complying with Laplace allocation. Meanwhile, the bit step length of the existing lattice vector quantizer (such as G.719) is integer bits (for example, one bit) during coding, so the step length is too long in low bit allocation, which causes a too concentrated bit allocation and the limited bits can not be used more efficiently; in addition, the grid code book of a single bit of the codec occupies too much storage space.

SUMMARY OF THE INVENTION

The technical problem to be solved in the invention is to provide an audio coding method and system of lattice vector quantization to obtain a good voice information source coding effect.

To solve the above technical problem, the invention provides an audio coding method of lattice vector quantization, comprising:

dividing frequency domain coefficients of an audio signal for which a modified discrete cosine transform (MDCT) has been performed into a plurality of coding sub-bands, and quantizing and coding amplitude envelope value of each coding sub-band to obtain coded bits of amplitude envelopes;

performing bit allocation on each coding sub-band, and performing normalization, quantization and coding respectively on vectors in a low bit coding sub-band in a pyramid lattice vector quantization and on vectors in a high bit coding sub-band in a sphere lattice vector quantization to obtain coded bits of the frequency domain coefficients, wherein, the low bit coding sub-band is a coding sub-band in which the number of bits allocated to a single frequency domain coefficient is less than a preset threshold value, the high bit coding sub-band is a coding sub-band in which the number of bits allocated to a single frequency domain coefficient is greater than or equal to a preset threshold value; and multiplexing and packing the coded bits of the amplitude envelope and the coded bits of the frequency domain coefficients of each coding sub-band, then sending to a decoding side.

Preferably, when the coding sub-bands are divided, the frequency domain coefficients after the MDCT is performed are divided into several coding sub-bands with a uniform interval, or are divided into several coding sub-bands with a non-uniform interval according to auditory perception feature.

Preferably, before the step of performing bit allocation on each coding sub-band, the method further comprises: calculating an initial value of importance of each coding sub-band according to the amplitude envelope value of each coding sub-band;

in the step of performing bit allocation on each coding sub-band, the bit allocation is performed on each frequency domain coefficient in each coding sub-band according to the importance of each coding sub-band, wherein, during the bit allocation, bit allocation step length and importance-reduction step length after the bit allocation are both variable.

Preferably, the initial value of importance is calculated according to an optimal bit value and a scaling factor complying with the auditory perception feature under the maximum quantization signal to noise ratio gain condition, or is the quantization exponent $Th_q(j)$ or $\lfloor \mu \times \log_2[Th(j)]+v \rfloor$ of each coding sub-band amplitude envelope, wherein, $\mu>0$, and $\mu$ and $v$ are both real numbers.

Preferably, the process of performing bit allocation on each coding sub-band comprises:

calculating a bit consumption average value of one frequency domain coefficient;

calculating an optimal bit value under the maximum quantization signal to noise ratio gain condition according to a code rate distortion theory;

calculating the initial value of importance of each coding sub-band in bit allocation;

performing bit allocation on each coding sub-band according to the importance of each coding sub-band: increasing the number of coded bits of each frequency domain coefficient in the coding sub-band with the maximum importance, and decrease the importance of the coding sub-band; till the sum of the number of bits consumed by all the coding sub-bands can meet the maximum value under the condition of the bit limitation.

Preferably, the bit allocation step length and importance-reduction step length after the bit allocation of the low bit coding sub-band are less than bit allocation step length and importance-reduction step length after the bit allocation of the zero bit coding sub-band and high bit coding sub-band.

Preferably, the bit allocation step length and importance-reduction step length after the bit allocation of the low bit coding sub-band are 0.5; the bit allocation step length and importance-reduction step length after the bit allocation of the zero bit coding sub-band and high bit coding sub-band are both 1.

Preferably, the step of performing normalization and quantization on the low bit coding sub-band in a pyramid lattice vector quantization comprises:

performing normalization processing on all the frequency domain coefficients in the coding sub-band by using the quantized amplitude envelope value of the coding sub-band, and grouping them to form a plurality of multidimensional to-be-quantized vectors; performing quantization processing on each to-be-quantized vector; wherein, the step of performing quantization processing on each to-be-quantized vector comprises: performing an energy regulation on a 8-dimension to-be-quantized vector in the coding sub-band, and quantizing the energy-regulated 8-dimension to-be-quantized vector to a $D_8$ lattice point; and comparing energy of the $D_8$ lattice point obtained by the quantization with a maximum pyramid surface energy radius in a coding code book, if the energy of the $D_8$ lattice point is less than or equal to the maximum pyramid surface energy radius, calculating a quantization index of the $D_8$ lattice point in the code book; if the energy of the $D_8$ lattice point is greater than the maximum pyramid surface energy radius, performing an energy truncation on a regulated to-be-quantized vector of the coding sub-band till the energy of the quantization lattice point of the energy-trunked to-be-quantized vector is not greater than the maximum pyramid surface energy radius, and meanwhile continuously adding an energy for the energy-trunked to-be-quantized vector till the energy of the $D_8$ lattice point to which the energy-added to-be-quantized vector is quantized is more than the maximum pyramid surface energy radius, and then determining the last $D_8$ lattice point whose energy is no greater than the maximum pyramid surface energy radius to be a vector quantization lattice point, and calculating the quantization index of the vector quantization lattice point in the code book;

and/or the step of performing normalization and quantization on the high bit coding sub-band in a sphere lattice vector quantization comprises:

performing normalization processing on all the frequency domain coefficients in the coding sub-band by using the quantized amplitude envelope value of the coding sub-band, and grouping then to form a plurality of multidimensional to-be-quantized vectors; performing quantization processing on each to-be-quantized vector; wherein, the step of performing quantization processing on each to-be-quantized vector comprises:

performing an energy regulation on a 8-dimension to-be-quantized vector in the coding sub-band, and quantizing the energy-regulated 8-dimension to-be-quantized vector to a $D_8$ lattice point;

dividing a value of the $D_8$ lattice point obtained through quantization by 2 to a power of the number of allocated bits $2^{region\_bit(j)}$, and then re-quantizing to the $D_8$ lattice point, judging whether the $D_8$ lattice point re-quantized is a zero vector, if yes, determining that a zero vector condition is met, if not, determining that the zero vector condition is not met, wherein, region_bit(j) represents the number of bits allocated to one frequency domain coefficient $j^{th}$ coding sub-band;

if the zero vector condition is met, calculating an index vector of the $D_8$ lattice point; and if the zero vector condition is not met, performing energy truncation on a value of a to-be-quantized vector till the zero vector condition is met, backing up a multiple value w of the to-be-quantized vector itself, adding the backup multiple value w to the energy-trunked to-be-quantized vector, then quantizing to the $D_8$ lattice point, judging whether the zero vector condition is met, if not, calculating a latest index vector k of the $D_8$ lattice point meeting the zero vector condition, if yes, adding continuously the backup multiple value w to the to-be-quantized vector and then quantizing to the $D_8$ lattice point till the zero vector condition is not met.

Preferably, in the step of performing the energy regulation on the 8-dimension to-be-quantized vector, firstly searching a below table for code book sequence number index and energy scaling factor scale corresponding to the number of bits according to the number of bits region_bit(j) allocated to one frequency domain coefficient in the coding sub-band j where the 8-dimension to-be-quantized vector is located; then performing the energy regulation on the to-be-quantized vector according to a following equation:

$$\tilde{Y}_{j,scale}^{m}=(Y_j^m-a)*\text{scale(index)}$$

wherein, $Y_j^m$ represents the $m^{th}$ normalized 8-dimension to-be-quantized vector in the coding sub-band j, $\tilde{Y}_{j,scale}^{m}$ represents a 8-dimension vector after performing the energy regulation on $Y_j^m$, $a=(2^{-6},2^{-6},2^{-6},2^{-6},2^{-6},2^{-6},2^{-6},2^{-6})$;

| The number of bits Region_bit | Code book sequence number Index | Energy scaling factor Scale | Maximum pyramid surface energy radius LargeK |
|---|---|---|---|
| 1 | 0 | 0.5 | 2 |
| 1.5 | 1 | 0.65 | 4 |
| 2 | 2 | 0.85 | 6 |
| 2.5 | 3 | 1.2 | 10 |
| 3 | 4 | 1.6 | 14 |
| 3.5 | 5 | 2.25 | 22 |
| 4 | 6 | 3.05 | 30 |
| 4.5 | 7 | 4.64 | 44 | in the step of quantizing the energy-regulated 8-dimension to-be-quantized vector to the $D_8$ lattice point, quantizing the energy-regulated 8-dimension vector $\tilde{Y}_{j,scale}^{m}$ to the $D_8$ lattice point $\tilde{Y}_j^m$ with a following equation:

$$\tilde{Y}_j^m = f_{D_8}(\tilde{Y}_{j,scale}^m)$$

wherein, $f_{D_8}(\bullet)$ represents a quantizing operator for mapping a certain 8-dimension vector to the $D_8$ lattice point.

The step of calculating the quantization index of the $D_8$ lattice point $\tilde{Y}_j^m$ in the code book comprises:

step 1, labeling the lattice points on each pyramid surface according to magnitude of the pyramid surface energy;

wherein, for an integer lattice point grid $Z^L$ whose dimension is L, the pyramid surface whose energy radius is K is defined as:

$$S(L, K) = \left\{ Y = (y_1, y_2, \ldots, y_L) \in Z^L \mid \sum_{i=1}^{L} |y_i| = K \right\}$$

wherein, N(L,K) is noted as the number of lattice points in S(L,K), and for the integer grid $Z^L$, there are following recursion formulas for N(L,K):

$$N(L,0)=1(L\geq 0), N(0,K)=0(K\geq 1)$$

$$N(L,K)=N(L-1,K)+N(L-1,K-1)+N(L,K-1)(L\geq 1, K\geq 1);$$

for an integer lattice point $Y=(y_1, y_2, \ldots, y_L) \in Z^L$ on the pyramid surface whose energy surface radius is K, a number b in $[0, 1, \ldots, N(L,K)-1]$ is used to identify, and b is referred to as a label of the lattice point, and steps for solving the label b are as follows:

step 1.1, letting b=0, i=1, k=K, l=L, calculating N(m,n), (m<=L, n<=K) according to the recursion formulas, and defining:

$$\text{sgn}(x) = \begin{cases} 1 & x > 0 \\ 0 & x = 0 \\ -1 & x < 0 \end{cases};$$

step 1.2, if $y_i=0$, then b=b+0;
if $|y_i|=1|$, then $$b = b + N(l-1, k) + \left[\frac{1-\text{sgn}(y_i)}{2}\right] N(l-1, k-1);$$

if $|y_i|>1$, then $$b = b + N(l-1, k) + 2\sum_{j=1}^{|y_i|-1} N(l-1, k-j) + \left[\frac{1-\text{sgn}(y_i)}{2}\right] N(l-1, k-|y_i|);$$

step 1.3, $k=k-|y_i|$, l=l-1, i=i+1, if k=0 now, stopping searching, b(j, m)=b, which is the label of Y, or else, continuing step 1.2;

step 2, labeling the lattice point uniformly on all the pyramid surfaces;

wherein, the uniform label of the lattice point on all the pyramid surfaces is calculated according to the number of lattice points on each pyramid surface and the label of the lattice point on its own pyramid surface, $$\text{index\_b}(j, m) = b(j, m) + \sum_{kk=0}^{K-2} N(8, kk)$$

wherein, kk is an even number, b(j,m) is the label of $D_8$ lattice point $\tilde{Y}_j^m$ on the pyramid surface where the $D_8$ lattice point $\tilde{Y}_j^m$ is located, and index_b(j,m) is the quantization index of the $D_8$ lattice point $\tilde{Y}_j^m$ in the code book.

Preferably,
the step of coding the low bit coding sub-band in a pyramid lattice vector quantization comprises:

performing Huffman coding on the quantization indexes of all the low bit coding sub-bands; and if a total number of consumed bits of the Huffman coded quantization indexes of all the low bit coding sub-bands is less than a total number of bits needed for natural coding of the quantization indexes of all the low bit coding sub-bands, then using the Huffman coding and setting a frequency domain coefficient Huffman coding flag to be 1 or true, using bits saved by the Huffman coding to modify the number of allocated bits of the coding sub-band and perform vector quantization and coding again on the coding sub-band after the number of allocated bits is modified; if the total number of consumed bits of the Huffman coded quantization indexes of all the low bit coding sub-bands is greater than or equal to the total number of bits needed for natural coding of the quantization indexes of all the low bit coding sub-bands, performing natural coding on the quantization index again, and setting the frequency domain coefficient Huffman coding flag to be 0 or false.

Preferably, the step of using bits saved by the Huffman coding to modify the number of allocated bits of the coding sub-band comprises:

calculating the number of bits saved by the Huffman coding;

finding a coding sub-band with a maximum importance in all the coding sub-bands, if the number of bits allocated to the coding sub-band has reached the maximum value of the number of bits possibly allocated to the coding sub-band, adjusting the importance of the coding sub-band to be the lowest, and not modifying the number of allocated bits for the coding sub-band any more, if the number of bits allocated to the coding sub-band has not reached the maximum value of the number of bits possibly allocated to the coding sub-band, then performing bit allocation modification on the coding sub-band with the maximum importance; and in the process of bit allocation modification, allocating 1 bit to the coding sub-band with the number of allocated bits being 0, and the importance after the bit allocation is reduced by 1; allocating 0.5 bit to the coding sub-band with the number of allocated bits being greater than 0 and less than 5, and the importance after the bit allocation is reduced by 0.5; allocating 1 bit to the coding sub-band with the number of allocated bits is greater than 5, and the importance after the bit allocation is reduced by 1.

Preferably, after each time the number of allocated bits is modified, i.e. the number of bit allocation modification iterations count is added by 1, if the number of bit allocation modification iterations count has reached a preset upper limit or the number of bits which can be used is less than the number of bits needed for the bit allocation modification, the bit allocation modification process ending.

Preferably, the sequence of multiplexing and packing the coded bits is as: an amplitude envelope Huffman coding flag, a frequency domain coefficient Huffman coding flag, the number of bit allocation modification iterations, coded bits of the amplitude envelope, coded bits of the frequency domain coefficient.

Preferably, when the Huffman coding is performed on the quantization indexes of all the low bit coding sub-bands, different code books are used to code the vector quantization index of the coding sub-band according to the number of bits allocated to one frequency domain coefficient in the coding sub-band.

To solve the above technical problem, the invention further provides an audio decoding method of lattice vector quantization, comprising:

decoding each amplitude envelope coded bit in a to-be-decoded bit steam to obtain an amplitude envelope quantization exponent of each coding sub-band;

performing bit allocation on each coding sub-band, and performing decoding, inverse quantization and inverse normalization of pyramid lattice vector quantization on a low bit coding sub-band to obtain a frequency domain coefficient of the low bit coding sub-band, and performing decoding, inverse quantization and inverse normalization of sphere lattice vector quantization on a high bit coding sub-band to obtain a frequency domain coefficient of the high bit coding sub-band; wherein, the low bit coding sub-band is a coding sub-band in which the number of bits allocated to one frequency domain coefficient is less than a preset threshold value, the high bit coding sub-band is a coding sub-band in which the number of bits allocated to one frequency domain coefficient is greater than or equal to a preset threshold value; and performing an inverse modified discrete cosine transform (IMDCT) on the frequency coefficient for which a noise filling is performed to obtain a final audio signal.

Preferably, before the step of performing bit allocation on each coding sub-band, the method further comprises: calculating an initial value of importance of each coding sub-band according to the amplitude envelope value of each coding sub-band;

in the step of performing bit allocation on each coding sub-band, bit allocation is performed on each frequency domain coefficient in each coding sub-band according to the importance of each coding sub-band, wherein, during the bit allocation, the bit allocation step length and the importance-reduction step length after the bit allocation are both variable.

Preferably, after the bit allocation is performed and before the decoding, the bit allocation modification is performed on the coding sub-band for count times again according to a value of the number of bit allocation modification iterations count and the importance of each coding sub-band at a coding side.

Preferably, when the bit allocation is performed, the bit allocation step length and the importance-reduction step length after the bit allocation of the low bit coding sub-band are less than the bit allocation step length and the importance-reduction step length after the bit allocation of the zero bit coding sub-band and high bit coding sub-band;

when bit allocation is modified, the bit-modification step length and the importance-reduction step length after the bit-modification of the low bit coding sub-band are less than the bit-modification step length and the importance-reduction step length after the bit-modification of the zero bit coding sub-band and high bit coding sub-band.

Preferably, the bit allocation step length and the importance-reduction step length after the bit allocation of the low bit coding sub-band are both 0.5; the bit allocation step length and the importance-reduction step length after the bit allocation of the zero bit coding sub-band and high bit coding sub-band are both 1.

Preferably, in the step of performing decoding, inverse quantization and inverse normalization of pyramid lattice vector quantization on the low bit coding sub-band, the vector quantization index of the low bit coding sub-band is obtained by performing Huffman coding or direct decoding on the low bit coding sub-band according to the frequency domain coefficient Huffman coding flag of the coding side, and the inverse quantization and inverse normalization of pyramid lattice vector quantization are performed on all the vector quantization indexes to obtain the frequency domain coefficient of the low bit coding sub-band; in the step of performing decoding, inverse quantization and inverse normalization of sphere lattice vector quantization on the high bit coding sub-band, natural decoding is directly used to obtain the vector quantization index of the high bit coding sub-band, and the inverse quantization and inverse normalization of the sphere lattice vector quantization are performed on all the vector quantization indexes to obtain the frequency domain coefficient of the high bit coding sub-band.

To solve the above technical problem, the invention further provides an audio coding system of lattice vector quantization, comprising: a modified discrete cosine transform (MDCT) unit, an amplitude envelope calculating unit, an amplitude envelope quantizing and coding unit, a bit allocating unit, a normalization processing unit, a classification lattice vector quantizing and coding unit, and a bit stream multiplexer; wherein, the MDCT unit is configured to perform the MDCT on an audio signal to generate frequency domain coefficients;

the amplitude envelope calculating unit is connected to the MDCT unit and is configured to divide the frequency domain coefficients generated by the MDCT unit into a plurality of coding sub-bands, and calculate an amplitude envelope value of each coding sub-band;

the amplitude envelope quantizing and coding unit is connected to the amplitude envelope calculating unit and is configured to quantize and code the amplitude envelope value of each coding sub-band to generate a coded bit of the amplitude envelope of each coding sub-band;

the bit allocating unit is connected to the amplitude envelope quantizing and coding unit and is configured to perform bit allocation to obtain the number of coded bits allocated to each frequency domain coefficient in each coding sub-band;

the normalization processing unit is connected to the MDCT unit and is configured to use the quantization amplitude envelope value of the coding sub-band to perform normalization processing on all the frequency domain coefficients in each coding sub-band;

the classification lattice vector quantizing and coding unit is connected to the normalization processing unit and the bit allocating unit and is configured to perform quantization and coding on the normalized to-be-quantized vectors in a low bit coding sub-band and a high bit coding sub-band respectively in a pyramid lattice vector quantization and a sphere lattice vector quantization to obtain the coded bit of the frequency domain coefficient; wherein, the low bit coding sub-band is a coding sub-band in which the number of bits allocated to one frequency domain coefficient is less than a preset threshold value, the high bit coding sub-band is a coding sub-band in which the number of bits allocated to one frequency domain coefficient is greater than or equal to a preset threshold value;

the bit stream multiplexer is connected to the amplitude envelope quantizing and coding unit and the classification lattice vector quantizing and coding unit and is configured to multiplex the coded bits of each coding sub-band and the coded bits of the frequency domain coefficients and send to a decoding side.

Preferably, when dividing the coding sub-bands, the amplitude envelope calculating unit divides the frequency domain coefficients after the MDCT is performed into several coding sub-bands with a uniform interval, or divides into several coding sub-bands with a non-uniform interval according to auditory perception feature.

Preferably, the bit allocating unit comprises an importance calculating module and a bit allocating module which are connected, wherein, the importance calculating module is configured to calculate an initial value of importance of each coding sub-band according to the amplitude envelope value of the coding sub-band;

the bit allocating module is configured to perform bit allocation on each frequency domain coefficient in each coding sub-band according to the importance of each coding sub-band, wherein, during the bit allocation, bit allocation step length and importance-reduction step length after the bit allocation are both variable.

Preferably, the initial value of importance is calculated according to an optimal bit value and a scaling factor complying with the auditory perception feature under the maximum quantization signal to noise ratio gain condition, or is the quantization exponent $Th_q(j)$ or $\lfloor \mu \times \log_2[Th(j)] + v \rfloor$ of each coding sub-band amplitude envelope, wherein, $\mu > 0$, and $\mu$ and $v$ are both real numbers.

Preferably, when calculating the initial value of the importance, the importance calculating module firstly calculates a bit consumption average value of one frequency domain coefficient; then calculates an optimal bit value under the maximum quantization signal to noise ratio gain condition according to a code rate distortion theory; then calculates the initial value of importance of each coding sub-band in bit allocation according to the bit consumption average value and the optimal bit value;

the importance calculating module performing bit allocation on each coding sub-band according to the importance of each coding sub-band comprises: increasing the number of coded bits of each frequency domain coefficient in the coding sub-band with the maximum importance, and decrease the importance of the coding sub-band; till the sum of the numbers of bits consumed by all the coding sub-bands meets the maximum value under the condition of the bit limitation.

Preferably, when the bit allocating module performs bit allocation, the bit allocation step length and importance-reduction step length after the bit allocation of the low bit coding sub-band are less than the bit allocation step length and the importance-reduction step length after the bit allocation of the zero bit coding sub-band and the high bit coding sub-band.

Preferably, when the bit allocating module performs the bit allocation, the bit allocation step length and importance-reduction step length after the bit allocation of the low bit coding sub-band are both 0.5; the bit allocation step length and importance-reduction step length after the bit allocation of the zero bit coding sub-band and the high bit coding sub-band are both 1.

Preferably, the classification lattice vector quantizing and coding unit comprises a classification processing module and a pyramid lattice vector quantizing module, wherein, the classification processing module is connected to the normalization processing unit and is configured to group the normalized frequency domain coefficients to form a multidimensional to-be-quantized vector, and forward the normalized to-be-quantized vector of the low bit coding sub-band to the pyramid lattice vector quantizing module;

the pyramid lattice vector quantizing module is connected to the classification processing module and is configured to perform the pyramid lattice vector quantization on the after the normalized to-be-quantized vector of each low bit coding sub-band; the pyramid lattice vector quantizing module comprises a first energy regulating sub-module, a first lattice point quantizing sub-module, a first energy adjusting sub-module and quantization index calculating sub-module, wherein, the first energy regulating sub-module is configured to perform the energy regulation on a 8-dimension to-be-quantized vector in the coding sub-band;

the first lattice point quantizing sub-module is connected to the first energy regulating sub-module and is configured to quantize the 8-dimension to-be-quantized vector to a $D_8$ lattice point;

the first energy adjusting sub-module is connected to the first lattice point quantizing sub-module and is configured to compare energy of the $D_8$ lattice point with a maximum pyramid surface energy radius in a coding code book, if the energy of the $D_8$ lattice point is less than or equal to the maximum pyramid surface energy radius, notify the quantization index calculating sub-module to calculate a quantization index of the $D_8$ lattice point in the code book; if the energy of the $D_8$ lattice point is greater than the maximum pyramid surface energy radius, perform an energy truncation on the regulated to-be-quantized vector in the coding sub-band, and notify the first lattice point quantizing sub-module to truncate the energy till the energy of the quantization lattice point of the energy-trunked to-be-quantized vector is not greater than the maximum pyramid surface energy radius, and meanwhile continuously add an energy to the energy-trunked to-be-quantized vector, and notify the first lattice point quantizing sub-module to quantize the energy-added to-be-quantized vector to the $D_8$ lattice point till the energy of the $D_8$ lattice point to which the energy-added to-be-quantized vector is quantized is more than the maximum pyramid surface energy radius, and notify the quantization index calculating sub-module to calculate the quantization index of the last $D_8$ lattice point whose energy is not greater than the maximum pyramid surface energy radius in the code book;

the index quantization calculating module is connected to the first energy adjusting sub-module and is configured to calculate the quantization index of the $D_8$ lattice point in the code book according to the notification of the first energy adjusting sub-module;

and the classification lattice vector quantizing and coding unit further comprises a sphere lattice vector quantizing module connected to the classification processing module; the classification processing module is further configured to forward the normalized to-be-quantized vector in the high bit coding sub-band to the sphere lattice vector quantizing module to process;

the sphere lattice vector quantizing module is configured to perform sphere lattice vector quantization on the normalized to-be-quantized vector in the high bit coding sub-band; the sphere lattice vector quantizing module comprises a second energy regulating sub-module, a second lattice point quantizing sub-module, a zero vector condition judging sub-module, a second energy adjusting sub-module and an index vector calculating sub-module, wherein, the second energy regulating sub-module is configured to perform the energy regulation on the 8-dimension to-be-quantized vector in the coding sub-band;

the second lattice point quantizing sub-module is connected to the second energy regulating sub-module and is configured to quantize the 8-dimension to-be-quantized vector to the $D_8$ lattice point;

the zero vector condition judging sub-module is connected to the second lattice point quantizing sub-module and is configured to judge whether the $D_8$ lattice point meets the zero vector condition, if yes, notify the index vector calculating sub-module to calculate the index vector of the $D_8$ lattice point; if not, notify the second energy adjusting sub-module to adjust the energy of the to-be-quantized vector; the zero vector condition is to divide the $D_8$ lattice point value obtained by vector quantization by 2 to a power of the number of allocated bits $2^{region\_bit(j)}$, and then project to the $D_8$ lattice point, the projected $D_8$ lattice point value is a zero vector, wherein, region_bit(j) represents the number of bits allocated to one frequency domain coefficient in the $j^{th}$ coding sub-band;

the second energy adjusting sub-module is connected to the zero vector condition judging sub-module and the second lattice point quantizing sub-module and is configured to perform energy truncation on a value of the to-be-quantized vector, and notify the second lattice point quantizing sub-module to quantize the to-be-quantized vector after the energy truncation to the $D_8$ lattice point till the zero vector condition is satisfied; back up a multiple value w of the to-be-quantized vector itself, and add the backup multiple value w to the energy-trunked to-be-quantized vector, and notify the second lattice point quantizing sub-module to quantize the energy-trunked to-be-quantized vector to the $D_8$ lattice point till the zero vector condition is not satisfied; and notify the index vector calculating sub-module to calculate a latest index vector of the $D_8$ lattice point meeting the zero vector condition;

the index vector calculating sub-module is connected to the zero vector condition judging sub-module and the second energy adjusting sub-module and is configured to calculate the quantization index of the $D_8$ lattice point in the code book according to notifications from the zero vector condition judging sub-module and the second energy adjusting sub-module.

Preferably, the classification lattice vector quantizing and coding unit further comprises a coding type judging module, a Huffman coding module, a natural coding module and a bit allocation modifying module, wherein, the coding type judging module is configured to judge whether a total number of consumed bits of the Huffman coded quantization indexes of all the low bit coding sub-bands is less than a total number of bits needed for natural coding of the quantization indexes of all the low bit coding sub-bands, if yes, notify the Huffman coding module and bit allocation modifying module; if the total number of consumed bits of the Huffman coded quantization indexes of all the low bit coding sub-bands is greater than or equal to the total number of bits needed for natural coding of the quantization indexes of all the low bit coding sub-bands, notify the natural coding module;

the Huffman coding module is configured to perform the Huffman coding on the quantization index of the low bit coding sub-band, and set frequency domain coefficient Huffman coding flag to be 1 or true, the natural coding module is configured to perform the natural coding on the quantization index of the low bit coding sub-band and the index vector of the high bit coding sub-band;

the bit allocation modifying module is configured to use bits saved by the Huffman coding to modify the number of allocated bits of the coding sub-band, and notify the classification processing module to perform vector quantization and coding again after classifying the coding sub-bands with the number of allocated bits being modified.

Preferably, the bit allocation modifying module is configured to, when performing bit allocation, find a coding sub-band with a maximum importance in all the coding sub-bands, if the number of bits allocated to the coding sub-band has reached the maximum value of the number of bits possibly allocated to the coding sub-band, adjust the importance of the coding sub-band to be the lowest, and not modify the number of allocated bits for the coding sub-band any more, if the number of bits allocated to the coding sub-band has not reached the maximum value of the number of bits possibly allocated to the coding sub-band, then perform bit allocation modification on the coding sub-band with the maximum importance; and during the bit allocation modification, allocate 1 bit to the coding sub-band with the number of allocated bits being 0, and reduce the importance by 1 after the bit allocation; allocate 0.5 bit to the coding sub-band with the number of allocated bits being greater than 0 and less than 5, and reduce the importance by 0.5 after the bit allocation; allocate 1 bit to the coding sub-band with the number of allocated bits being greater than 5, and reduce the importance by 1 after the bit allocation.

Preferably, after each time the number of allocated bits is modified by the bit allocation modifying module, i.e. the number of bit allocation modification iterations count is added by 1, if the number of bit allocation modification iterations count has reached a preset upper limit or the number of bits which can be used is less than the number of bits needed for the bit allocation modification, end a process of the bit allocation modification.

Preferably, the sequence of the bit stream multiplexer multiplexing and packing the coded bits is as: an amplitude envelope Huffman coding flag, a frequency domain coefficient Huffman coding flag, the number of bit allocation modification iterations, coded bits of an amplitude envelope, coded bits of the frequency domain coefficient.

Preferably, when the Huffman coding module performs Huffman coding on the quantization indexes of all the low bit coding sub-bands, it uses different code books to code the vector quantization index of the coding sub-band according to the number of bits allocated to one frequency domain coefficient in the coding sub-band.

To solve the above technical problem, the invention further provides an audio decoding system of lattice vector quantization, comprising: a bit stream demultiplexer, a coding sub-band amplitude envelope decoding unit, a bit allocating unit, a frequency domain coefficient decoding unit, a classification lattice vector quantization inverse quantizing unit, an inverse normalization processing unit, a noise filling unit and an inverse modified discrete cosine transform (IMDCT) unit, wherein, the bit stream demultiplexer is configured to separate an amplitude envelope coded bit and domain coefficient coded bit from a to-be-decoded bit stream;

the coding sub-band amplitude envelope decoding unit is connected to the bit stream demultiplexer and is configured to decode the amplitude envelope coded bit output by the bit stream demultiplexer to obtain an amplitude envelope quantization exponent of each coding sub-band;

the bit allocating unit is connected to the amplitude envelope decoding unit and is configured to perform bit allocation to obtain the number of coded bits allocated to each frequency domain coefficient in each coding sub-band;

the frequency domain coefficient decoding unit is connected to the amplitude envelope decoding unit and the bit allocating unit and is configured to decode a low bit coding sub-band to obtain a quantization index of the low bit coding sub-band; and decode a high bit coding sub-band to obtain the index vector of the high bit coding sub-band, wherein, the low bit coding sub-band is a coding sub-band in which the number of bits allocated to one frequency domain coefficient is less than a preset threshold value, the high bit coding sub-band is a coding sub-band in which the number of bits allocated to one frequency domain coefficient is greater than or equal to a preset threshold value;

the classification lattice vector quantization inverse quantizing unit is configured to perform inverse quantization of the pyramid lattice vector quantization on the quantization index of the low bit coding sub-band, and perform inverse quantization of the sphere lattice vector quantization on the index vector of the high bit coding sub-band;

the inverse normalization processing unit is configured to perform inverse normalization on values after the inverse quantization has been performed for the coding sub-band, and obtain the frequency domain coefficient;

the noise filling unit is configured to perform noise filling on the sub-band to which no bit is allocated in the frequency domain coefficient output value output by the inverse normalization processing unit;

the inverse modified discrete cosine transform (IMDCT) unit is connected to the noise filling unit and is configured to perform IMDCT on the frequency domain coefficient for which the noise filling has been performed to obtain an audio signal.

Preferably, the bit allocating unit comprises an importance calculating module and a bit allocating module connected to each other, wherein, the importance calculating module is configured to calculate an initial value of the importance of each coding sub-band according to the coding sub-band amplitude envelope value;

the bit allocating module is configured to perform bit allocation on each frequency domain coefficient in each coding sub-band according to the importance of each coding sub-band, wherein, during the bit allocation, the bit allocation step length and the importance-reduction step length after the bit allocation are both variable.

Preferably, the bit allocating unit further comprises a bit allocation modifying module connected to the bit allocating module, and the bit allocation modifying module is configured to perform the bit allocation modification on the coding sub-band for count times again after performing the bit allocation according to a value of the number of bit allocation modification iterations count and the importance of each coding sub-band at a coding side.

Preferably, when the bit allocating module performs the bit allocation, the bit allocation step length and the importance-reduction step length after the bit allocation of the low bit coding sub-band are less than the bit allocation step length and the importance-reduction step length after the bit allocation of the zero bit coding sub-band and high bit coding sub-band.

When the bit allocation modifying module performs bit allocation modifying, the bit allocation modifying step length and the importance-reduction step length after the bit allocation modifying of the low bit coding sub-band are less than the bit allocation modifying step length and the importance-reduction step length after the bit allocation modifying of the zero bit coding sub-band and the high bit coding sub-band.

Preferably, the frequency domain coefficient decoding unit, when performing decoding on the low bit coding sub-band, performs Huffman coding on the low bit coding sub-band according to the frequency domain coefficient Huffman coding flag at the coding side or performs natural coding to obtain the vector quantization index of the low bit coding sub-band; when performing decoding on the high bit coding sub-band, directly performs natural coding to obtain the vector quantization index of the high bit coding sub-band.

Preferably, the classification lattice vector quantization inverse quantizing unit comprises a classification processing module and a pyramid lattice vector quantization inverse quantizing module, wherein, the classification processing module is configured to forward the quantization index of the low bit coding sub-band to the pyramid lattice vector quantization inverse quantizing module;

the pyramid lattice vector quantization inverse quantizing module is configured to perform inverse quantization on the quantization index of the low bit coding sub-band; wherein, the pyramid lattice vector inverse quantizing module comprises a first lattice point inverse quantizing sub-module and a first energy inverse regulating sub-module connected to each other, wherein, the first lattice point inverse quantizing sub-module is configured to determine an energy pyramid surface in which the quantization index of the low bit coding sub-band is located and a label on the energy pyramid surface and further more solve a corresponding $D_8$ lattice point;

the first energy inverse regulating sub-module is configured to perform energy inverse regulation on the solved $D_8$ lattice point Y, and obtain $$\overline{Y}_j^m = (Y+a)/\text{scale(index)}$$

wherein, $a=(2^{-6},2^{-6},2^{-6},2^{-6},2^{-6},2^{-6},2^{-6},2^{-6})$, scale(index) is a scaling factor;

the inverse normalization processing unit is configured to perform an inverse normalization processing on $\overline{Y}_j^m$ to obtain the frequency domain coefficient of the $m^{th}$ vector of the coding sub-band j recovered at the decoding side:

$$\overline{X}_j^m = 2^{Th_q(j)/2} \cdot Y_j^m$$

wherein, $Th_q(j)$ is an amplitude envelope quantization exponent of the $j^{th}$ coding sub-band.

Preferably, the classification lattice vector inverse quantizing unit further comprises a sphere lattice vector quantization inverse quantizing module; the classification processing module is further configured to forward the index vector of the high bit coding sub-band to the sphere lattice vector quantization inverse quantizing module to process;

the sphere lattice vector quantization inverse quantizing module is configured to perform inverse quantization on the index vector of the high bit coding sub-band; the sphere lattice vector quantization inverse quantizing module comprises a second lattice point inverse quantizing sub-module and a second energy inverse regulating sub-module connected to each other, wherein, the second lattice point inverse quantizing sub-module is configured to solve the $D_8$ lattice point corresponding to the index vector, wherein, the step of solving the $D_8$ lattice point corresponding to the index vector comprises:

calculating $x=k*G$, and calculating ytemp= $x/(2\hat{}(\text{region\_bit}(j)))$;

and calculating the $D_8$ lattice point $y=x-f_{D8}(\text{ytemp})*(2\hat{}(\text{region\_bit}(j)))$; wherein, k is the index vector of the vector quantization, region_bit(j) represents the number of bits allocated to one frequency domain coefficient in the coding sub-band j; G is a generator matrix of the $D_8$ lattice point and its form is as follows:

$$G = \begin{bmatrix} 2 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 0 & 0 & 1 & 0 & 0 & 0 & 0 \\ 1 & 0 & 0 & 0 & 1 & 0 & 0 & 0 \\ 1 & 0 & 0 & 0 & 0 & 1 & 0 & 0 \\ 1 & 0 & 0 & 0 & 0 & 0 & 1 & 0 \\ 1 & 0 & 0 & 0 & 0 & 0 & 0 & 1 \end{bmatrix}$$

the second energy inverse regulating sub-module is configured to perform energy inverse regulation on the solved $D_8$ lattice point, and obtain $$\overline{Y}_j^m = y*\text{scale}(\text{region\_bit}(j))/(2^{\text{region\_bit}(j)}) + a$$

wherein, $a=(2^{-6},2^{-6},2^{-6},2^{-6},2^{-6},2^{-6},2^{-6},2^{-6})$, scale(region_bit(j)) is the scaling factor;

the inverse normalization processing unit is configured to perform inverse normalization processing on $\overline{Y}_j^m$ to obtain the frequency domain coefficient of the $m^{th}$ vector of the coding sub-band j recovered in the decoding side:

$$\overline{X}_j^m = 2^{Th_q(j)/2} \cdot Y_j^m$$

wherein, $Th_q(j)$ is an amplitude envelope quantization exponent of the $j^{th}$ coding sub-band.

The audio coding method and system of lattice vector quantization in the invention, consider fully the allocation characteristic of the voice information source, perform quantization on the to-be-quantized vector in a merged lattice vector quantization, specifically, the pyramid lattice vector quantization and the sphere lattice vector quantization are respectively used for the low bit coding sub-band and the high bit coding sub-band according to the number of bits allocated to the coding sub-band, and the inverse process of the coding is used in the decoding, thereby obtaining a good voice information source coding effect. In addition, a bit allocation with a variable step length is used for the bit allocation, and the bit allocation step length of one frequency domain coefficient may be adjusted minimally as half an bit, thus improving the efficiency of bits. Meanwhile, the pyramid lattice vector quantizer with the low bit step length is designed, and its lattice point label algorithm has a low complexity, thus storage space is reduced. In addition, in the sphere lattice vector quantization of the high bit coding sub-band, a new criterion is used for the code-book-extension label, thus further reducing the complexity of the algorithm of the lattice vector quantizer. The algorithm for saving bits is also designed in the coding process.

PREFERRED EMBODIMENTS OF THE PRESENT INVENTION

Figure 1:
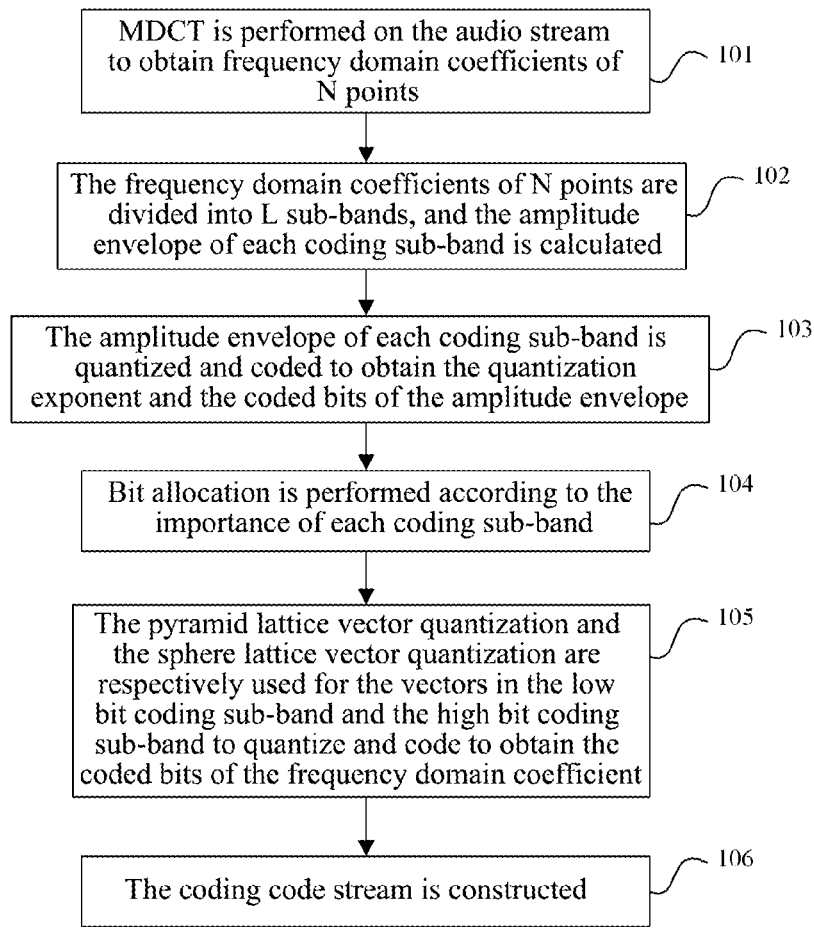
FIG. 1 is a schematic diagram of the audio coding method of lattice vector quantization in accordance with the invention.

The core idea of the invention is to quantize the to-be-quantized vectors in a merged lattice vector quantization, that is, a pyramid lattice vector quantization and a sphere lattice vector quantization are used respectively for a low bit coding sub-band and a high bit coding sub-band according to the number of bits allocated to the coding sub-band, and the inverse process of the coding is used for decoding, thus obtaining a good coding effect. In addition, the bit allocation with a variable step length is used for bit allocation to improve the usage efficiency of the bits.

The invention is described in detail below in four parts, i.e. a coding method, a decoding method, a coding system and a decoding system.

1. Coding Method

The audio coding method of lattice vector quantization in the invention comprises the following steps:

A. dividing frequency domain coefficients of an audio signal for which a modified discrete cosine transform (MDCT) has been performed into a plurality of coding sub-bands, and quantizing and coding amplitude envelope value of each coding sub-band to obtain coded bits of amplitude envelopes;

when dividing the coding sub-band, dividing the frequency domain coefficients after the MDCT into several equally spaced coding sub-bands, or dividing them into several non-uniform coding sub-bands according to the auditory perception feature;

B. performing a bit allocation on each coding sub-band, and performing normalization, quantization and coding respectively on vectors in a low bit coding sub-band with a pyramid lattice vector quantization and on vectors in a high bit coding sub-band in a sphere lattice vector quantization to obtain coded bits of the frequency domain coefficients, wherein, the low bit coding sub-band is a coding sub-band in which the number of bits allocated to one frequency domain coefficient is less than a preset threshold value, the high bit coding sub-band is a coding sub-band in which the number of bits allocated to one frequency domain coefficient is greater than or equal to a preset threshold value;

before the step of performing bit allocation for each coding sub-band, calculating an initial value of importance of each coding sub-band according to the amplitude envelope value of the coding sub-band; then performing the bit allocation for every frequency domain coefficient in the coding sub-band according to the importance of the coding sub-band, wherein, during the bit allocation, the bit allocation step length and the importance-reduction step length after the bit allocation are both variable.

During the bit allocation for each frequency domain coefficient in the coding sub-band according to the importance of the coding sub-band, the bit allocation step length and the importance-reduction step length after the bit allocation are variable; specifically, when performing bit allocation for the coding sub-band, the bit allocation step length and the importance-reduction step length after the bit allocation of the low bit coding sub-band are less than the bit allocation step length and the importance-reduction step length after the bit allocation of the zero bit coding sub-band and high bit coding sub-band, wherein, the zero bit coding sub-band is referred to a coding sub-band in which the number of bits allocated to one frequency domain coefficient is zero in the coding sub-band;

the initial value of importance may be calculated according to an optimal bit value under the maximum quantization signal to noise ratio gain condition and a scaling factor complying with the auditory perception characteristic, and a quantization exponent $Th_q(j)$ of amplitude envelope of the coding sub-band, or $\lfloor \mu \times \log_2[Th(j)] + \nu \rfloor$ (wherein, $\mu > 0$, and $\mu$ and $\nu$ are both real numbers) may also be the initial value of importance for the bit allocation of each coding sub-band, wherein, $j = 0, \ldots, L-1$;

C. multiplexing and packing the coded bits of the amplitude envelope and the coded bits of the frequency domain coefficients of each coding sub-band, and sending them to a decoding side.

Example 1

Coding Method

FIG. 1 is a structure schematic diagram of the audio coding method of lattice vector quantization in accordance with the example of the invention. The audio stream with a frame length being 20 ms and a sampling rate being 32 KHz is taken for instance to illustrate the audio coding method of the invention in the example. The method of the invention is also suitable under the conditions of other frame lengths and sampling rates. As shown in FIG. 1, the method comprises the following steps:

Step 101, Modified Discrete Cosine Transform (MDCT) is performed on the to-be-coded audio stream to obtain frequency domain coefficients on N sampling points in the frequency domain.

The specific implementing in the step may be:

constituting a 2N-point time domain sampling signal $\bar{x}(n)$ by an N-point time domain sampling signal $x(n)$ of the current frame and an N-point time domain sampling signal $x_{old}(n)$ of the last frame, wherein, the 2N-point time domain sampling signal may be represented in the following equation:

$$\bar{x}(n) = \begin{cases} x_{old}(n) & n = 0, 1, \ldots, N-1 \\ x(n-N) & n = N, N+1, \ldots, 2N-1 \end{cases} \quad (1)$$

MDCT is performed on $\bar{x}(n)$ to obtain the following frequency domain coefficients:

$$X(k) = \sum_{n=0}^{2N-1} \bar{x}(n)w(n)\cos\left[\frac{\pi}{N}\left(n + \frac{1}{2} + \frac{N}{2}\right)\left(k + \frac{1}{2}\right)\right] \quad (2)$$

$$k = 0, \ldots, N-1$$

Wherein, $w(n)$ represents a sine window function, the expression is:

$$w(n) = \sin\left[\frac{\pi}{2N}\left(n + \frac{1}{2}\right)\right] \quad n = 0, \ldots, 2N-1 \quad (3)$$

When the frame length is of 20 ms and the sampling rate is of 32 kHz, 640 frequency domain coefficients are obtained. Other frame lengths and sampling rates may also used to obtain the corresponding number N of frequency domain coefficients.

Step 102, the N-point frequency domain coefficients are divided into several coding sub-bands, and the amplitude envelope of each coding sub-band is calculated.

In the example, a non-uniform sub-bands division is used and a frequency domain amplitude envelope (called as amplitude envelope for short) of each sub-band is calculated.

The step may be implemented in the following sub-steps.

Step 102a, the frequency domain coefficients in the frequency range needed to be processed are divided into L sub-bands (which may be called as coding sub-bands).

In the example, the frequency range needed to be processed is of 0~13.6 kHz, and the non-uniform sub-band division may be performed according to human ear perception characteristics. Table 1 shows a specific division.

In table 1, the frequency domain coefficients in the frequency range of 0~13.6 kHz are divided into 28 coding sub-bands, i.e. L=28; and the frequency domain coefficients more than 13.6 kHz are set to 0.

Step 102b, the amplitude envelope of each coding sub-band is calculated according to the following equation:

$$Th(j) = \sqrt{\frac{1}{HIndex(j) - LIndex(j) + 1} \sum_{k=LIndex(j)}^{HIndex(j)} X(k)X(k)} \quad (4)$$

$$j = 0, 1, \ldots, L-1$$

Wherein, LIndex(j) and HIndex(j) represent respectively starting frequency point and ending frequency point of the $j^{th}$ coding sub-band, whose specific values are as shown in table 1.

TABLE 1

Frequency domain non-uniform sub-band division example

| Sub-band sequence number | Starting frequency point (LIndex) | Ending frequency point (HIndex) | Sub-band width (BandWidth) |
|---|---|---|---|
| 0 | 0 | 7 | 8 |
| 1 | 8 | 15 | 8 |
| 2 | 16 | 23 | 8 |
| 3 | 24 | 31 | 8 |
| 4 | 32 | 47 | 16 |
| 5 | 48 | 63 | 16 |
| 6 | 64 | 79 | 16 |
| 7 | 80 | 95 | 16 |
| 8 | 96 | 111 | 16 |
| 9 | 112 | 127 | 16 |
| 10 | 128 | 143 | 16 |
| 11 | 144 | 159 | 16 |
| 12 | 160 | 183 | 24 |
| 13 | 184 | 207 | 24 |
| 14 | 208 | 231 | 24 |
| 15 | 232 | 255 | 24 |
| 16 | 256 | 279 | 24 |
| 17 | 280 | 303 | 24 |
| 18 | 304 | 327 | 24 |
| 19 | 328 | 351 | 24 |
| 20 | 352 | 375 | 24 |
| 21 | 376 | 399 | 24 |
| 22 | 400 | 423 | 24 |
| 23 | 424 | 447 | 24 |
| 24 | 448 | 471 | 24 |
| 25 | 472 | 495 | 24 |
| 26 | 496 | 519 | 24 |
| 27 | 520 | 543 | 24 |

Step 103, the amplitude envelope value of each coding sub-band is quantized and coded to obtain a quantization exponent of the amplitude envelope and quantization exponent coded bits of the amplitude envelope (i.e. the coded bits of the amplitude envelope).

Each of amplitude envelopes of coding sub-bands calculated according to equation (4) is quantized by using equation (5) to obtain the quantization exponent of the amplitude envelope of each coding sub-band:

$$Th_q(j) = \lfloor 2 \log_2 Th(j) \rfloor \quad (5)$$

Wherein, $\lfloor x \rfloor$ represents rounded down, $Th_q(0)$ is the amplitude envelope quantization exponent of the first coding sub-band, whose range is limited in [−5, 34], that is, when $Th_q(0) < -5$, $Th_q(0) = -5$; when $Th_q(0) > 34$, $Th_q(0) = 34$.

The quantized amplitude envelope rebuilt according to the quantization exponent is $2^{Th_q(j)/2}$.

6 bits are used to code the amplitude envelope quantization exponent of the first coding sub-band, i.e. 6 bits are consumed.

The differential operation values between coding sub-band amplitude envelope quantization exponents are calculated by the following equation:

$$\Delta Th_q(j) = Th_q(j+1) - Th_q(j) \quad j = 0, \ldots, L-2 \quad (6)$$

The amplitude envelope may be corrected by the following way to ensure the $\Delta Th_q(j)$ is in the range of $[-15, 16]$:

if $\Delta Th_q(j) < -15$, $\Delta Th_q(j) = -15$, $Th_q(j) = Th_q(j+1)+15$, $j=L-2, \ldots, 0$;

if $\Delta Th_q(j) > 16$, $\Delta Th_q(j) = 16$, $Th_q(j+1) = Th_q(j)+16$, $j=0, \ldots, L-2$;

performing Huffman coding for $\Delta Th_q(j)$, $j=0, \ldots, L-2$, and calculating the number of consumed bits (Huffman coded bits) at the moment. If the number of Huffman coded bits are now greater than the number of the bits fixed allocated (in the example, greater than (L-1)×5), then natural coding is used to code $\Delta Th_q(j)$, $j=0, \ldots, L-2$, and amplitude envelope Huffman coding flag bit Flag_huff_rms is set to 0. Or else, the Huffman coding is used to code $\Delta Th_q(j)$, $j=0, \ldots, L-2$, and the amplitude envelope Huffman coding flag bit Flag_huff_rms is set to 1. The coded bits of the amplitude envelope quantization exponent (i.e. coded bits of amplitude envelope differential value) and the amplitude envelope Huffman coding flag bit need to be delivered into MUX.

Step 104, a bit allocation is performed on each coding sub-band according to the importance of each coding sub-band.

The initial value of the importance of each coding sub-band is calculated firstly according to a code rate distortion theory and coding sub-band amplitude envelope information, and then the bit allocation is performed on each sub-band according to the importance of each sub-band. The step may be implemented in the following sub-steps:

Step 104a, the bit consumption average value for single frequency domain coefficient is calculated.

The number of the bits, bit_sides, consumed by side information and the number of the bits, bits_Th, consumed by a coding sub-band amplitude envelope are deducted from the total number of the bits, bits_available, which can be provided by the frames with the length being of 20 ms to obtain the number of the left bits, bits_left, which can be used for frequency domain coefficient coding, i.e.:

$$\text{bits\_left} = \text{bits\_available} - \text{bit\_sides} - \text{bits\_}Th \quad (7)$$

The side information comprises bits for Huffman coding flag Flag_huff_rms, frequency domain coefficient Huffman coding flag Flag_huff_plvq and the number of iterations count. Flag_huff_rms is used to identify whether the Huffman coding is used for sub-band amplitude envelope; Flag_huff_plvq is used to identify whether the Huffman coding is used when performing vector quantization and coding on the frequency domain coefficients; and the number of iterations count is used to identify the number of iterations in bit allocation modifying (as described in detail in the later steps).

The bit consumption average value $\overline{R}$ of single frequency domain coefficient is calculated:

$$\overline{R} = \frac{\text{bits\_left}}{HIndex(L-1)+1} \quad (8)$$

Wherein, L is the number of the coding sub-bands.

Step 104b, the optimal bit value is calculated according to the code rate distortion theory under the maximum quantization signal to noise ratio gain condition.

The code rate distortion based on independent Gaussian allocation random variable is optimized by Lagrange method, and the optimal bit allocation value under the maximum quantization signal to noise ratio gain condition of each coding sub-band under the code rate distortion limit may be calculated to be:

$$rr(j) = [\overline{R} + R_{min}(j)], j=0, \ldots, L-1 \quad (9)$$

Wherein, $$R_{min}(j) = \frac{1}{2}[Th_q(j) - \text{mean\_}Th_q], j=0, \ldots, L-1 \quad (10)$$

and $$\text{mean\_}Th_q = \frac{1}{HIndex(L-1)+1} \sum_{i=0}^{L-1} Th_q(i)[HIndex(i) - LIndex(i) + 1] \quad (11)$$

Step 104c, the initial value of importance of each coding sub-band in the bit allocation is calculated.

The initial value of importance of each coding sub-band used to control bit allocation in real bit allocation may be obtained by using the above optimal bit value and scaling factors complying with the human ear perception characteristic:

$$rk(j) = \alpha \times rr(j) = \alpha[\overline{R} + R_{min}(j)], j=0, \ldots, L-1 \quad (12)$$

Wherein, $\alpha$ is the scaling factor, which is associated to the coding bit rate and can be obtained through statistical analysis, usually $0 < \alpha < 1$. In the example, $\alpha$ is valued at 0.6. $rk(j)$ represents the importance of the $j^{th}$ coding sub-band being used for bit allocation.

Step 104d, the bit allocation is performed on each coding sub-band based on the importance of each coding sub-band.

The specific description is as follows:

the coding sub-band where the maximum value is located in each $rk(j)$ is firstly found, and the label of the coding sub-band is assumed to be $j_k$, then the number of coded bits of each frequency domain coefficient in the coding sub-band is increased and the importance of the coding sub-band is reduced; meanwhile, the total number of bits consumed for the sub-band coding bit_band_used($j_k$) is calculated; finally, the sum of the numbers of bits consumed by all the coding sub-bands sum(bit_band_used (j)), $j=0, \ldots, L-1$ is calculated; the above process is repeated till the sum of the numbers of consumed bits can meet the maximum value under the condition of the bit limitation condition.

The number of the allocated bits is referred to the number of bits allocated to one frequency domain coefficient in one coding sub-band. The number of bits consumed in one coding sub-band is referred to the number of bits allocated to one frequency domain coefficient in one coding sub-band multiplying the number of frequency domain coefficients included in the coding sub-band.

In the example, the step length for allocating bits to the coding sub-band with the number of allocated bits being 0 is 1 bit, and the importance-reduction step length after the bit allocation is 1; the step length for allocating additional bits to the coding sub-band with the number of allocated bits being greater than 0 and less than threshold value 5 is 0.5 bit; and the importance-reduction step length after the additional bit allocation is also 0.5; the step length for allocating additional bits to the coding sub-band with the number of allocated bits being greater than the threshold value 5 is 1 and the importance-reduction step length after the additional bit allocation is also 1.

The bit allocation method in the step may be represented as the following pseudo-code:

```
letting region_bit(j)=0, j=0,1,...,L − 1;
for the coding sub-bands 0,1,...,L − 1:
{ seeking j_k = argmax [rk(j)];
              j=0,...,L-1 if region_bit(j_k)<5
  {
  if region_bit(j_k)=0
  letting region_bit(j_k) = region_bit(j_k) + 1;
  calculating bit_band_used(j_k) = region_bit(j_k) * BandWidth(j_k);
  letting rk(j_k) = rk(j_k) − 1;
  or else, if region_bit(j_k)>=1
  letting region_bit(jk) = region_bit(jk) + 0.5;
  calculating bit_band_used(j_k) = region_bit(j_k) * BandWidth(j_k)*0.5;
  letting rk(j_k) = rk(j_k) − 0.5;
  }
  or else, if region_bit(j_k)>=5
  {
  letting region_bit(j_k) = region_bit(j_k) + 1;
```

$$\text{letting } rk(j_k) = \begin{cases} rk(j_k) - 1 & \text{if region\_bit}(j_k) < \text{MaxBit} \\ -100 & \text{else} \end{cases};$$

```
  calculating bit_band_used(j_k) = region_bit(j_k) × BandWidth(j_k);
  }
  calculating bit_used_all = sum(bit_band_used(j))  j=0,1,...,L − 1;
  if bit_used_all < bits_left − 24, returning and seeking j_k again in each coding sub-band,
circularly calculating bit allocation value; wherein, 24 is the maximum value of the width
of the coding sub-band;
  or else, ending the cycle, calculating the bit allocation value and outputting the current bit
allocation value.
}
```

At last, the remained bits whose number is less than 24 are allocated to the coding sub-bands meeting the requirements according to the following principle based on the importance of the coding sub-band. Preferentially, 0.5 bit is allocated to each frequency domain coefficient in the coding sub-band whose bit allocation is 1, and meanwhile the importance of the coding sub-band is reduced by 0.5; or else, 1 bit is allocated to each frequency domain coefficient in the coding sub-band whose bit allocation is 0, and meanwhile the importance of the coding sub-band is reduced by 1, till bit_left−bit_used_all<4 when the bit allocation is over.

Wherein, MaxBit is the maximum number of the coded bits which can be allocated to the one frequency domain coefficient in the coding sub-band. In the example, MaxBit=9 is used. The value may be properly adjusted according to the coding code rate of the codec. region_bit(j) is the number of the bits allocated to one frequency domain coefficient in the $j^{th}$ coding sub-band.

Step 105, the pyramid lattice vector quantization and the sphere lattice vector quantization are respectively used for the vectors in the low bit coding sub-band and the high bit coding sub-band to quantize and code to obtain the coded bits of the frequency domain coefficient.

Figure 2:
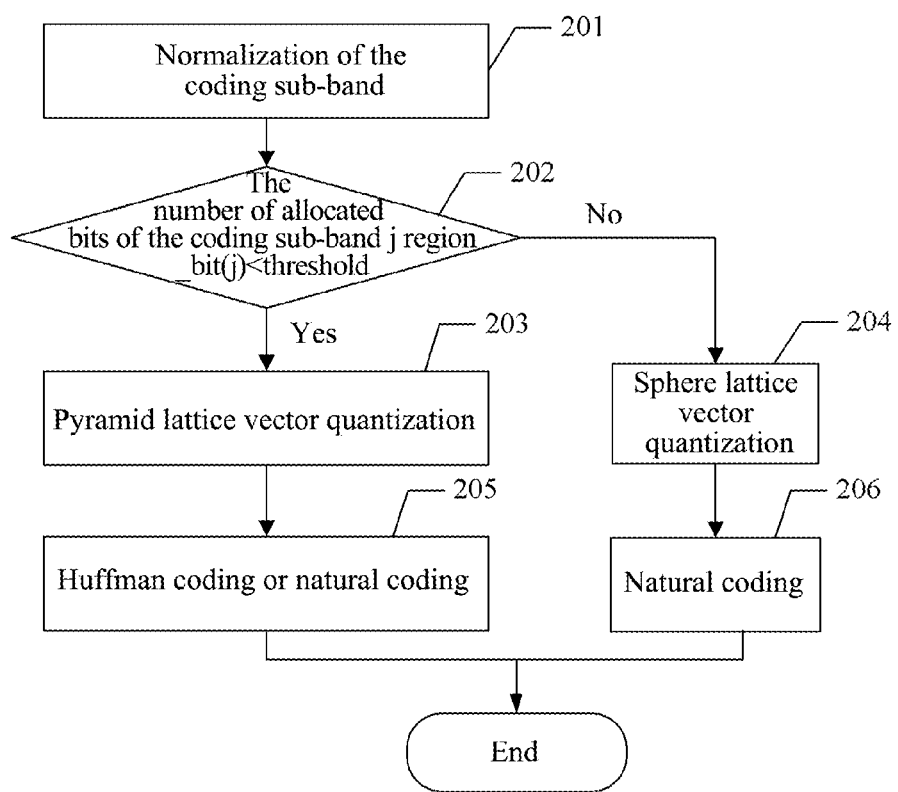
FIG. 2 is a schematic diagram of the process of lattice vector quantization in accordance with the invention.

The process of the classification lattice vector quantization and coding in the invention is described after in detail with reference to FIG. 2.

Step 106, the coding code stream is constructed.

Figure 9:
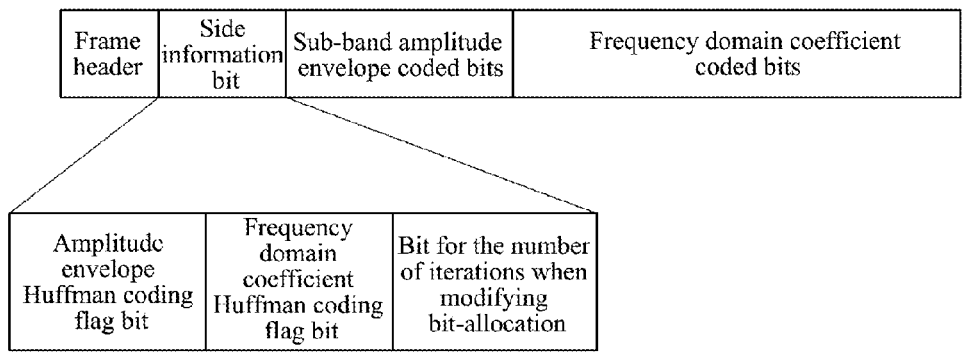
FIG. 9 is a schematic diagram of the composition of the code stream in accordance with the example of the invention.

FIG. 9 is the schematic diagram of the code stream composition in the example of the invention. Firstly, the side information is written into the bit stream multiplexer MUX in the following sequence, Flag_huff_rms, Flag_huff_plvq and count; then the coding sub-band amplitude envelope coding sub-band is written into MUX, and then the coded bits of the frequency domain coefficient are written into MUX; at last, the code stream written by the above order is transmitted to the decoding side.

The classification lattice vector quantization and coding process

Specifically, as shown in FIG. 2, the classification lattice vector quantization and coding process comprises the following steps.

Step 201, the quantization amplitude envelope value of the coding sub-band is used to perform normalization processing on all the frequency domain coefficients in the coding sub-band, and all the frequency domain coefficients are grouped to form several to-be-quantized vectors.

The quantization amplitude envelope $2^{Th_q(j)/2}$ of the coding sub-band j is used to perform normalization processing on all the frequency domain coefficients Xj in the coding sub-band:

$$X_j^{normalized} = \frac{X_j}{2^{Th_q(j)/2}};$$

wherein, the continuous 8 frequency domain coefficients in the coding sub-band are grouped to form 1 8-dimension vector. Based on the division of the coding sub-band in table 1, the coefficients in the coding sub-band j are precisely grouped to form Lattice_D8(j) 8-dimension vectors. Each normalized and grouped 8-dimension to-be-quantized vector may be represented as $Y_j^m$, wherein, m represents the location of the 8-dimension vector in the coding sub-band, whose range is between 0 and Lattice_D8(j)−1.

Step 202, it is judged whether the number of the allocated bits of the coding sub-band j region_bit(j) is less than the preset threshold value, if yes, the coding sub-band is the low bit coding sub-band, and step 203 is performed, i.e. the pyramid lattice vector quantization is used to quantize, and step 205 is performed to code after the quantization; or else, the coding sub-band is the high bit coding sub-band, step 204 is performed, i.e. the sphere lattice vector quantization is used to quantize, and step 206 is performed after the quantization to code.

Step 203, the low bit coding sub-band is quantized with the pyramid lattice vector quantization.

In the example, the preset threshold value is 5, i.e. the number of the bits allocated to the low bit coding sub-band j meets: 1<=region_bit(j)<5.

In the example, the 8-dimension lattice vector based on the $D_8$ lattice point is used to quantize, wherein, the $D_8$ lattice point is defined as follows:

$$D_8 = \left\{ v = (v_1, v_2, \ldots, v_8)^T \in Z^8 \,\middle|\, \sum_{i=1}^{8} v_i = \text{even} \right\}$$

wherein, $Z^8$ represents the 8-dimension integer space. The basic method for mapping the 8-dimension vector to (that is, quantized to) the $D_8$ lattice point is described as follows:

it is assumed that x is an arbitrary real number, f(x) represents the rounding quantization for the integer which is closer to x of the two integers adjacent to x, w(x) represents the rounding quantization for the integer which is farther to x of the two integers adjacent to x. For any vector $X=(x_1, x_2, \ldots, x_8) \in R^8$, $f(X)=(f(x_1), f(x_2), \ldots, f(x_8))$ may be defined similarly. The minimum subscript in the components with the maximum absolute value of the rounding quantization error is selected in f(X) and is noted as k, hereafter $g(X)=(f(x_1), f(x_2), \ldots w(x_k), \ldots, f(x_8))$ is defined, then one and only one of the f(x) or g(X) is the value of the $D_8$ lattice point, and now the quantization value of the $D_8$ lattice point is:

$$f_{D_8}(x) = \begin{cases} f(X), & \text{if } f(X) \in D_8 \\ g(X) & \text{if } g(X) \in D_8. \end{cases}$$

The process of performing the pyramid lattice vector quantization on the to-be-quantized vector of the low bit coding sub-band comprises:

Step 203*a*, the energy regulation is performed on the to-be-quantized vector.

According to the number, region_bit(j), of bits allocated to one frequency domain coefficient in the coding sub-band j where the to-be-quantized vector is located, a code book sequence number (index) and an energy scaling factor (scale) corresponding to the number of bits are looked up in the below table 2; then the energy regulation is performed on the to-be-quantized vector according to the following equation:

$$\tilde{Y}_{j,scale}{}^m = (Y_j{}^m - a) * \text{scale(index)}$$

wherein, $Y_j{}^m$ represents the $m^{th}$ normalized 8-dimension to-be-quantized vector in the coding sub-band j, $\tilde{Y}_{j,scale}{}^m$ represents a 8-dimension vector after performing the energy regulation on $Y_j{}^m$, $a=(2^{-6}, 2^{-6}, 2^{-6}, 2^{-6}, 2^{-6}, 2^{-6}, 2^{-6}, 2^{-6})$.

It should be noted that the following table 2 is obtained based on statistics, and the statistical method is:

firstly, limiting scale in a certain range and using a specified step length of 1 to calculate the mean-square error value corresponding to the pyramid lattice vector quantization and inverse quantization under a certain quantization bit number condition when adopting a corresponding step length, and seeking a specified area range where the scale value corresponding to the minimum mean-square error value is located; and using a specified step length 2 to search the mean-square error value corresponding to the pyramid lattice vector quantization and inverse quantization under a certain quantization bit number condition, and seeking a scale value corresponding to the minimum mean-square error value, which is the corresponding scale value under a certain quantization bit condition.

TABLE 2

Corresponding relationship among the number of the pyramid lattice vector quantization bits, the code book sequence number, the energy scaling factor and the maximum pyramid surface energy radius

| Number of bits region_bit | Code book sequence number Index | Energy scaling factor Scale | Maximum pyramid surface energy radius LargeK |
|---|---|---|---|
| 1 | 0 | 0.5 | 2 |
| 1.5 | 1 | 0.65 | 4 |
| 2 | 2 | 0.85 | 6 |
| 2.5 | 3 | 1.2 | 10 |
| 3 | 4 | 1.6 | 14 |
| 3.5 | 5 | 2.25 | 22 |
| 4 | 6 | 3.05 | 30 |
| 4.5 | 7 | 4.64 | 44 |

Step 203*b*, the energy-regulated vector is quantized to the lattice point.

The energy-regulated vector is firstly quantized to the lattice point, and then it is judged that whether the pyramid surface energy of the quantized lattice point/is less than or equal to the maximum pyramid surface energy radius in the coding code book, if yes, proceeding to step 203*c*, or else, performing energy truncation on the energy-regulated vector and then performing lattice point quantization.

Quantizing the energy-regulated 8-dimension vector $\tilde{Y}_{j,scale}{}^m$ to the $D_8$ lattice point $\tilde{Y}_j{}^m$:

$$\tilde{Y}_j{}^m = f_{D_8}(\tilde{Y}_{j,scale}{}^m)$$

wherein, $f_{D_8}(\bullet)$ represents a quantizing operator for mapping a certain 8-dimension vector to the $D_8$ lattice point.

The pyramid surface energy of the $D_8$ lattice point $\tilde{Y}_j{}^m$ is calculated and compared with the maximum pyramid surface energy radius in the coding code book. The pyramid surface energy of the $D_8$ lattice point $\tilde{Y}_j{}^m$ is the sum of the absolute values of all components of $\tilde{Y}_j{}^m$. The coding code book means the set of all the $D_8$ lattice points used to quantize the to-be-quantized vector.

If the pyramid surface energy of the $D_8$ lattice point $\tilde{Y}_j{}^m$ is not greater than the maximum pyramid surface energy radius LargeK(index), step 203*c* is directly executed, and the quantization index of the lattice point in the code book is calculated.

If the pyramid surface energy of the lattice point $\tilde{Y}_j{}^m$ is greater than the maximum pyramid surface energy radius, an energy truncation is performed on a regulated to-be-quantized vector $\tilde{Y}_{j,scale}{}^m$ of the coding sub-band till the energy of the quantization lattice point of the energy-regulated to-be-quantized vector is not greater than the maximum pyramid surface energy radius; at the moment, an energy is continuously added to the energy-trunked to-be-quantized vector till the energy of the $D_8$ lattice point to which the vector is quantized is more than the maximum pyramid surface energy radius; the last $D_8$ lattice point whose energy is not more than the maximum pyramid surface energy radius is determined to be the quantization value of the to-be-quantized vector, i.e. to be the lattice point generating the vector quantization index.

When the energy of the lattice point $\hat{Y}_j^m$ is greater than the maximum pyramid surface energy radius, the specific process of performing energy truncation on the to-be-quantized vector may be described in the following pseudo code:

calculating the pyramid surface energy of the $D_8$ lattice point $\hat{Y}_j^m$, i.e. solving the sum of absolute values of every component of $\hat{Y}_j^m$:

```
temp _ K = sum(|Ŷⱼᵐ|)
Ybak = Ŷⱼᵐ
Kbak = temp _ K
If temp_K > LargeK(index)
{
    While temp_K > LargeK(index)
    {
        Ŷⱼ,scaleᵐ = Ŷⱼ,scaleᵐ / 2 ,
        Ŷⱼᵐ = f_D₈ (Ŷⱼ,scaleᵐ)
        temp _ K = sum(|Ŷⱼᵐ|)
    }
    w = Ŷⱼ,scaleᵐ / 16
    Ybak = Ŷⱼᵐ
    Kbak = temp _ K
    While temp_K <= LargeK(index)
    {
        Ybak = Ŷⱼᵐ
        Kbak = temp _ K
        Ŷⱼ,scaleᵐ = Ŷⱼ,scaleᵐ + w
        Ŷⱼᵐ = f_D₈ (Ŷⱼ,scaleᵐ)
        temp _ K = sum(|Ŷⱼᵐ|)
    }
}
Ŷⱼᵐ = Ybak
temp _ K = Kbak
```

At the moment, $\hat{Y}_j^m$ is the last $D_8$ lattice point whose energy is not greater than the maximum pyramid surface energy radius, and temp_K is the energy of the lattice points.

Step 203c, the vector quantization index of the $D_8$ lattice point $\tilde{Y}_j^m$ in the code book is calculated.

The step of calculating the vector quantization index of the $D_8$ lattice point $\tilde{Y}_j^m$ in the code book comprises:

step 1, labeling the lattice points on each pyramid surface respectively according to the size of the pyramid surface energy.

For the integer lattice point grid $Z^L$ whose dimension is L, the pyramid surface with the energy radius being K is defined as:

$$S(L, K) = \left\{ Y = (y_1, y_2, \ldots, y_L) \in Z^L \,\Big|\, \sum_{i=1}^{L} |y_i| = K \right\}$$

It is noted that N(L,K) is the number of the lattice points in the S(L,K), and for the integer grid $Z^L$, the following recursion formulas are for N(L,K):

$$N(L,0)=1(L \geq 0), N(0,K)=0(K \geq 1)$$

$$N(L,K)=N(L-1,K)+N(L-1,K-1)+N(L,K-1)(L \geq 1, K \geq 1);$$

For the integer lattice point $Y=(y_1, y_2, \ldots, y_L) \in Z^L$ on the pyramid surface with the energy surface radius being K, a number b in [0, 1, ..., N(L,K)−1] is used to identify, and b is referred to as a label of the lattice point, and steps for solving the label b are as follows:

step 1.1, letting b=0, i=1, k=K, l=L, calculating N(m,n), (m<=L, n<=K) according to the recursion formulas, and defining:

$$\text{sgn}(x) = \begin{cases} 1 & x > 0 \\ 0 & x = 0 \\ -1 & x < 0; \end{cases}$$

step 1.2, if $y_i$=0, then b=b+0;
if $|y_i|$=1, then $$b = b + N(l-1, k) + \left[\frac{1 - \text{sgn}(y_i)}{2}\right] N(l-1, k-1);$$

if $|y_i|>1$, then $$b = b + N(l-1, k) + 2\sum_{j=1}^{|y_i|-1} N(l-1, k-j) + \left[\frac{1 - \text{sgn}(y_i)}{2}\right] N(l-1, k-|y_i|);$$

step 1.3, k=k−|y_i|, l=l−1, i=i+1, if k=0 now, stopping searching, b(j, m)=b, which is the label of Y, or else, continuing step 1.2;

step 2, labeling the numbers uniformly for the lattice points on all the pyramid surfaces;

wherein, the label of each lattice point on all the pyramid surfaces is calculated according to the number of lattice points on each pyramid surface and the label of the lattice point on its own pyramid surface, $$\text{index\_b}(j, m) = b(j, m) + \sum_{kk=0}^{K-2} N(8, kk)$$

wherein, kk is an even number, b(j,m) is the label of $D_8$ lattice point $\tilde{Y}_j^m$ on the pyramid surface where the $D_8$ lattice point $\tilde{Y}_j^m$ is located, and index_b(j,m) is the index of the $D_8$ lattice point $\tilde{Y}_j^m$ in the code book, that is, the index of the $m^{th}$ 8-dimension vector in the coding sub-band j.

step 203d, the above steps 203a~203c are repeated till the calculation of the vector quantization index has been completed for each 8-dimension vector of each the coding sub-bands with the number of the coded bits being greater than 0 but less than threshold value 5.

Step 204, the quantization is performed on the high bit coding sub-band in the sphere lattice quantization.

The number of bits allocated to the high bit coding sub-band j satisfies 5<=region_bit(j)<=9.

Here, the $D_8$ lattice based 8-dimension lattice vector quantization is also used.

The process of performing the sphere lattice quantization on the to-be-quantized vector of the high bit coding sub-band comprises:

Step 204a, energy regulation is performed on the to-be-quantized vector.

The following energy regulation is performed on the $m^{th}$ normalized to-be-quantized vector $Y_j^m$ in the coding sub-band j:

$$\hat{Y}_j^m = \beta(Y_j^m - a)$$

wherein, $a = (2^{-6}, 2^{-6}, 2^{-6}, 2^{-6}, 2^{-6}, 2^{-6})$, $$\beta = \frac{2^{region\_bit(j)}}{scale(region\_bit(j))},$$

and scale(region_bit(j)) represents the energy scaling factor when the number of allocated bits of one frequency domain coefficient in the coding sub-band is region_bit(j), and the corresponding relationship of them may be found according to table 3.

The statistical way for obtaining the below table 3 is the same as that for obtaining the below table 2

TABLE 3

Corresponding relationship between the number of allocated bits and the energy scaling factor of the sphere lattice vector quantization

| Number of allocated bits region_bit | Energy scaling factor scale |
|---|---|
| 5 | 6 |
| 6 | 6.2 |
| 7 | 6.5 |
| 8 | 6.2 |
| 9 | 6.6 |

Step 204b, the energy-regulated vector is quantized to the lattice point, and it is judged whether the quantization value $f_{D_8}(\hat{Y}_j^m / 2^{region\_bit(j)})$, which is obtained after the quantization lattice point value is divided by 2 to a power of the number of allocated bits $2^{region\_bit(j)}$ and then mapped to the lattice point, is a zero vector, if yes, it is to proceed to step 204c, or else, the energy truncation is performed on the energy-regulated vector and then the vector is quantized to the lattice point;

It is to map the energy-regulated $m^{th}$ to-be-quantized vector $\hat{Y}_j^m$ in the coding sub-band j to the $D_8$ lattice point $\tilde{Y}_j^m$:

$\tilde{Y}_j^m = f_{D_8}(\hat{Y}_j^m)$, wherein, $f_{D_8}(\bullet)$ represents a quantizing operator for mapping a certain 8-dimension vector to the $D_8$ lattice point.

It is to judge weather the quantization value $f_{D_8}(\hat{Y}_j^m / 2^{region\_bit(j)})$, which is obtained after the quantization lattice point value is divided by 2 to a power of the number of allocated bits $2^{region\_bit(j)}$ and then mapped to the lattice point, is a zero vector, i.e. whether all the components of the quantization value are zero, if yes, it is referred to that the zero vector condition is met, or else, it is referred to that the zero vector condition is not met.

If the zero vector condition is met, then step 204c is directly performed.

If the zero vector condition is not met, the energy truncation is performed on the energy-regulated vector $\hat{Y}_j^m$. In the example, the value of $\hat{Y}_j^m$ is divided by 2 till the zero vector condition $f_{D_8}(\tilde{Y}_j^m / 2^{region\_bit(j)}) = 0$ is met, and the small multiple value of $\hat{Y}_j^m$ itself is backed up to be w, then the backup small multiple value w is added to the energy truncated vector $\hat{Y}_j^m$ and then the vector is quantized to the $D_8$ lattice point, and it is now judged whether the zero vector condition is met. If the zero vector condition is not met, the latest $D_8$ lattice point meeting the zero vector condition is taken as the quantization lattice point of the to-be-quantized vector, or else, the backup small multiple value w is continuously added to the vector $\hat{Y}_j^m$ and then the vector quantized to the $D_8$ lattice point, till the zero vector condition is not met.

The specific process of performing energy truncation of the to-be-quantized vector may be described in the following pseudo code:

```
temp_D = f_{D_8}(\tilde{Y}_j^m / 2^{region\_bit(j)})
Ybak = \tilde{Y}_j^m
Dbak = temp_D
While temp_D ≠ 0
{
    \hat{Y}_j^m = \hat{Y}_j^m / 2
    \tilde{Y}_j^m = f_{D_8}(\hat{Y}_j^m)
    temp_D = f_{D_8}(\tilde{Y}_j^m / 2^{region\_bit(j)})
}
w = \hat{Y}_j^m / 16
Ybak = \tilde{Y}_j^m
Dbak = temp_D
While temp_D = 0
{
    Ybak = \tilde{Y}_j^m
    Dbak = temp_D
    \hat{Y}_j^m = \hat{Y}_j^m + w
    \tilde{Y}_j^m = f_{D_8}(\hat{Y}_j^m)
    temp_D = f_{D_8}(\tilde{Y}_j^m / 2^{region\_bit(j)})
}
\tilde{Y}_j^m = Ybak
```

Step 204c, the index vector of the vector quantization of the $D_8$ lattice point $\tilde{Y}_j^m$ is generated.

The index of the vector quantization may be obtained by the following index vector generating equation:

$$k = (\tilde{Y}_j^m G^{-1}) \mod 2^{region\_bit(j)}$$

The index vector k of the $D_8$ lattice point $\tilde{Y}_j^m$ is output now, wherein, G is the generator matrix of the $D_8$ lattice point, and its form is as follows:

$$G = \begin{bmatrix} 2 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 0 & 0 & 1 & 0 & 0 & 0 & 0 \\ 1 & 0 & 0 & 0 & 1 & 0 & 0 & 0 \\ 1 & 0 & 0 & 0 & 0 & 1 & 0 & 0 \\ 1 & 0 & 0 & 0 & 0 & 0 & 1 & 0 \\ 1 & 0 & 0 & 0 & 0 & 0 & 0 & 1 \end{bmatrix}$$

Step 205, the vector quantization index of the low bit coding sub-band is coded; and the step ends.

As being described above, the number of bits allocated to the low bit coding sub-band meets: $1 \le region\_bit(j) < 5$.

Performing coding on the vector quantization index of the low bit coding sub-band comprises the following steps:

step 205a, Huffman coding is performed on the vector quantization index of the low bit coding sub-band.

The Huffman coding is performed on the vector quantization index in the set C composed of all the coding sub-bands in which the number of allocated bits of a single frequency domain coefficient is less than a certain threshold value. The vector quantization index index_b(j,k) of each 8-dimension vector in each coding sub-band is obtained based on the pyramid lattice vector quantization, wherein, k represents the $k^{th}$ 8-dimension vector of the coding sub-band j. Performing Huffman coding on the quantization index index_b(j,k) comprises the following scenes:

a. in all the coding sub-bands in which the number of bits allocated to one frequency domain coefficient is greater than 1, less than 5 and except 2, each four bits in the natural binary codes for each vector quantization index are divided into one group and the Huffman coding is performed on that group, and the sum of the numbers of bits of the Huffman coding for all the 4-bits groups is the number of bits consumed in the Huffman coding of the quantization index;

b. in all the coding sub-bands in which the number of bits allocated to one frequency domain coefficient is 2, 15 bits are used for the pyramid lattice vector quantization index of each 8-dimension vector to code;

the 15 bits are divided into 3 4-bits groups and 1 3-bits group, then the Huffman coding is performed on the groups, the sum of the numbers of consumed bits of the 4 groups of Huffman coding is the number of bits consumed in the Huffman coding of the quantization index;

c. when the number of bits allocated to one frequency domain coefficient of the coding sub-band is 1, if the quantization index is less than 127, then the quantization index is coded with 7 bits, that 7 bits are divided into 1 3-bits group and 1 4-bits group, the Huffman coding is performed respectively on the two groups, the sum of the numbers of bits consumed in the two groups of Huffman coding is the number of bits consumed in the Huffman coding of the quantization index;

d. when the number of bits allocated to one frequency domain coefficient of the coding sub-band is 1, if the quantization index is equal to 127, then its own natural binary code is defined as "1111 1110", 7 1s in front are divided into 1 3-bits group and 1 4-bits group, the Huffman coding is performed respectively on the two groups, the sum of the numbers of bits consumed in the two groups of Huffman coding is the number of bits consumed in the Huffman coding of the quantization index;

e. when the number of bits allocated to one frequency domain coefficient of the coding sub-band is 1, if the quantization index is equal to 128, then its own natural binary code is defined as "1111 1111", 7 1s in front are divided into 1 3-bits groups and 1 4-bits group, the Huffman coding is performed respectively on the two groups, the sum of the numbers of bits consumed in the two groups of Huffman coding is the number of bits consumed in the Huffman coding of the quantization index.

The method of performing Huffman coding on the quantization index may be described in the following pseudo code:

```
in all the coding sub-bands of region_bit(j) =1.5 and 2<region_bit(j)<5,
{
  n is in the range of [0, region_bit(j)×8/4−1], it is increased with the step length being 1
  and the following cycle is done:
  {
    letting index_b(j,k) shift toward right for 4*n bits,
    Calculating the low 4 bits tmp of the index_b(j,k), i.e. tmp = and(index_b(j,k), 15)
    Calculating the code word of tmp in the code book and the bit consumption number
thereof:
    plvq_codebook(j,k) = plvq_code(tmp+1);
    plvq_count(j,k) = plvq_bit_count(tmp+1);
    wherein, plvq_codebook(j,k) and plvq_count(j,k) are respectively the code word and the
bit consumption number in the Huffman coding code book of the k$^{th}$ 8-dimension vector of the
j$^{th}$ sub-band; plvq_bit_count and plvq_code are searched for based on table 4.
    The bit consumption total number after the Huffman coding is used is updated:
    bit_used_huff_all = bit_used_huff_all + plvq_bit_count(tmp+1);
  }
}
In the coding sub-band of region_bit(j) =2
{
  n is in the range of [0, region_bit(j)×8/4−2], it is increased with the step length being 1,
  and the following cycle is done:
  {
    Letting index_b(j,k) shift toward right for 4*n bits,
    Calculating the low 4 bits tmp of index_b(j,k), i.e. tmp = and(index_b(j,k), 15)
    Calculating the code word of tmp in the code book and the bit consumption number
thereof:
    plvq_count(j,k) = plvq_bit_count (tmp+1);
    plvq_codebook(j,k) = plvq_code (tmp+1);
    wherein, plvq_codebook(j,k) and plvq_count(j,k) are respectively the Huffman bit
consumption number and code word of the k$^{th}$ 8-dimension vector of the j$^{th}$ sub-band;
plvq_bit_count and plvq_code are searched for based on table 4.
    The bit consumption total number after the Huffman coding is used is updated:
    bit_used_huff_all = bit_used_huff_all + plvq_bit_count(tmp+1);
  }
  {
    A 3-bit condition is needed to be processed below:
    after index_b(j,k) is shifted toward right for [region_bit(j)×8/4−2]*4 bits,
    calculating the low 3 bits tmp of index_b(j,k), i.e. tmp = and(index_b(j,k), 7)
    calculating the code word of tmp in the code book and the bit consumption number
thereof:
    plvq_count(j,k) = plvq_bit_count _r2_3(tmp+1);
    plvq_codebook(j,k) = plvq_code _r2_3(tmp+1);
    wherein, plvq_count(j,k) and plvq_codebook(j,k) are respectively the Huffman bit
consumption number and code word of the k$^{th}$ 8-dimension vector of the j$^{th}$ sub-band;
plvq_bit_count_r2_3 and plvq_code_r2_3 are searched for based on table 5.
    The bit consumption total number after the Huffman coding is used is updated:
    bit_used_huff_all = bit_used_huff_all + plvq_bit_count(tmp+1);
  }
}
In the coding sub-band of region_bit(j) =1
{
```

-continued

```
If index_b(j,k)<127
{
{
Calculating the low 4 bits tmp of index_b(j,k), i.e. tmp = and(index_b(j,k), 15)
Calculating the code words of tmp in the code book and the bit consumption number
thereof:
    plvq_count(j,k) = plvq_bit_count_r1_4(tmp+1);
    plvq_codebook(j,k) = plvq_code_r1_4(tmp+1);
    wherein, plvq_count(j,k) and plvq_codebook(j,k) are respectively the Huffman bit
consumption number and code words of the k$^{th}$ 8-dimension vector of the j$^{th}$ sub-band;
plvq_bit_count_r1_4 and plvq_code_r1_4 are searched for based on table 6.
    The bit consumption total number after the Huffman coding is used is updated:
    bit_used_huff_all = bit_used_huff_all + plvq_bit_count(tmp+1);
}
{
A 3-bit condition is needed to be processed below:
Letting index_b(j,k) shift toward right for 4 bits,
Calculating the low 3 bits tmp of index_b(j,k) i.e. tmp = and(index_b(j,k), 7)
Calculating the code word of tmp in the code book and the bit consumption number
thereof:
    plvq_count(j,k) = plvq_bit_count_r1_3(tmp+1);
    plvq_codebook(j,k) = plvq_code_r1_3(tmp+1);
    wherein, plvq_count(j,k) and plvq_codebook(j,k) are respectively the Huffman bit
consumption number and code word of the k$^{th}$ 8-dimension vector of the j$^{th}$ sub-band; the code
book plvq_bit_count_r1_3 and plvq_code_r1_3 are searched for based on table 7.
    The bit consumption total number after the Huffman coding is used is updated:
    bit_used_huff_all = bit_used_huff_all + plvq_bit_count(tmp+1);
}
}
If index_b(j,k)=127
{its binary value is "1111 1110"
    For the three"1s" in front and the last four "1s", the Huffman tables of the table 7 and
table 6 are respectively searched,
    The calculation method is the same as that under the foregoing condition of
index_b(j,k)<127.
    The bit consumption total number after the Huffman coding is used is updated: a total of 8
bits are needed.
}
If index_b(j,k)=128
{its binary value is "1111 1111"
    For the three "1s" and the last four"1s", the Huffman tables of table 7 and table 6 are
respectively searched, the calculation method is the same as that under the foregoing condition
of index_b(j,k)<127.
    The bit consumption total number after the Huffman coding is used is updated: a total of 8
bits are needed.
}
}
```

TABLE 4

Pyramid vector quantization Huffman code table

| Tmp | Plvq_bit_count | plvq_code |
|---|---|---|
| 0 | 2 | 0 |
| 1 | 4 | 6 |
| 2 | 4 | 1 |
| 3 | 4 | 5 |
| 4 | 4 | 3 |
| 5 | 4 | 7 |
| 6 | 4 | 13 |
| 7 | 4 | 10 |
| 8 | 4 | 11 |
| 9 | 5 | 30 |
| 10 | 5 | 25 |
| 11 | 5 | 18 |
| 12 | 5 | 9 |
| 13 | 5 | 14 |
| 14 | 5 | 2 |
| 15 | 4 | 15 |

TABLE 5

Pyramid vector quantization Huffman code table

| Tmp | Plvq_bit_count_r2_3 | plvq_code_r2_3 |
|---|---|---|
| 0 | 1 | 0 |
| 1 | 4 | 1 |
| 2 | 4 | 15 |
| 3 | 5 | 25 |
| 4 | 3 | 3 |
| 5 | 3 | 5 |
| 6 | 4 | 7 |
| 7 | 5 | 9 |

TABLE 6

Pyramid vector quantization Huffman code table

| Tmp | Plvq_bit_count_r1_4 | plvq_code_r1_4 |
|---|---|---|
| 0 | 3 | 7 |
| 1 | 5 | 13 |
| 2 | 5 | 29 |
| 3 | 4 | 14 |
| 4 | 4 | 3 |
| 5 | 4 | 6 |

TABLE 6-continued

Pyramid vector quantization Huffman code table

| Tmp | Plvq_bit_count_r1_4 | plvq_code_r1_4 |
|---|---|---|
| 6 | 4 | 1 |
| 7 | 4 | 0 |
| 8 | 4 | 8 |
| 9 | 4 | 12 |
| 10 | 4 | 4 |
| 11 | 4 | 10 |
| 12 | 4 | 9 |
| 13 | 4 | 5 |
| 14 | 4 | 11 |
| 15 | 4 | 2 |

TABLE 7

Pyramid vector quantization Huffman code table

| Tmp | Plvq_bit_count_r1_3 | plvq_code_r1_3 |
|---|---|---|
| 0 | 2 | 1 |
| 1 | 3 | 0 |
| 2 | 3 | 2 |
| 3 | 4 | 7 |
| 4 | 4 | 15 |
| 5 | 3 | 6 |
| 6 | 3 | 4 |
| 7 | 3 | 3 |

When the Huffman coding is performed on the pyramid lattice vector quantization indexes of all the coding sub-bands, different code books are used to code the vector quantization index of the coding sub-band according to the number of bits allocated to one frequency domain coefficient in the coding sub-band.

Step 205b, it is judged whether the Huffman coding saves bits, if yes, the Huffman coding is used for the quantization index, and step 205c is performed, or else, the natural coding is performed on the quantization index.

By step 205a, the total number of bits consumed by the Huffman coded quantization indexes belonging to the 8-dimension vectors of all the coding sub-bands in C bit_used_huff_all is calculated. The bit_used_huff_all is compared with the sum of bits consumed by all the coding sub-bands in C sum(bit_band_used(j), j∈C), i.e. compared with the sum of products of the number of frequency domain coefficients of all the coding sub-bands in C and the number of bits allocated to one frequency domain coefficient in the coding sub-band. If bit_used_huff_all<sum(bit_band_used (j), j∈C), the bits of the Huffman coded quantization index is transmitted, and meanwhile the frequency domain coefficient Huffman coding flag Flag_huff_plvq is set to 1; or else, natural coding is performed on the quantization vector index, and the frequency domain coefficient Huffman coding flag Flag_huff_plvq is set to 0.

Step 205c, the bit allocation modification is performed, and the vector quantization and coding are performed again on the coding sub-band for which the bit allocation has been modified.

If the frequency domain coefficient Huffman coding flag Flag_huff_plvq is 0, the bit allocation of the coding sub-band is not modified. If frequency domain coefficient Huffman coding flag Flag_huff_plvq is 1, the bit allocation of the coding sub-band is modified with the bits saved by the Huffman coding.

When the bit allocation of the coding sub-band is modified, in the example, the bit-modification step length and importance-reduction step length after the bit-modification of the low bit coding sub-band are both 0.5; the bit-increasing step length and importance-reduction step length after the bit-increasing of the zero bit coding sub-band and high bit coding sub-band are both 1.

The low bit coding sub-band is a coding sub-band in which the number of bits allocated to one frequency domain coefficient is less than a preset threshold value, and the high bit coding sub-band is a coding sub-band in which the number of bits allocated to one frequency domain coefficient is greater than or equal to a preset threshold value. The zero bit coding sub-band is referred to the coding sub-band in which the number of bits allocated to one frequency domain coefficient is zero.

Figure 3:
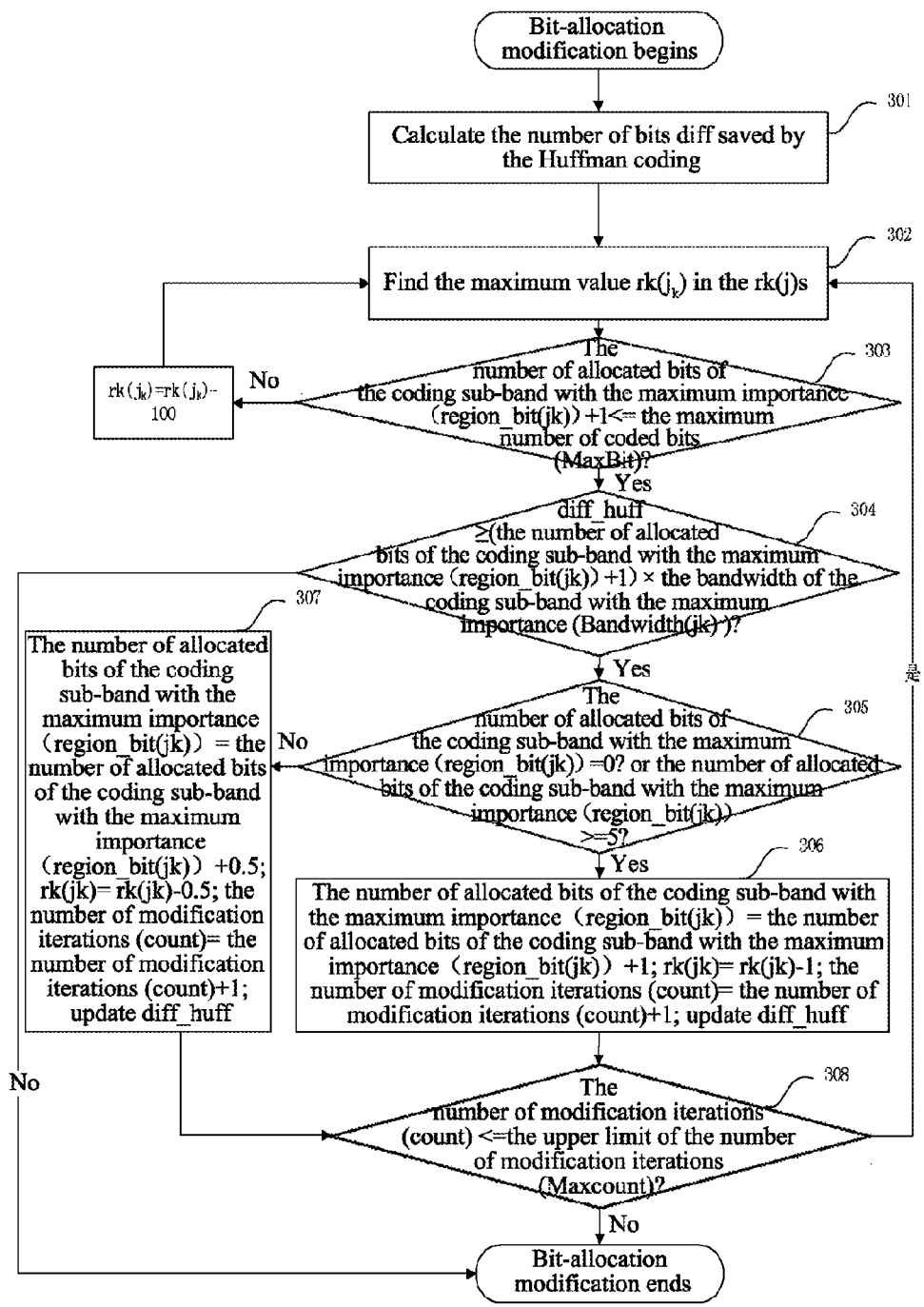
FIG. 3 is a schematic diagram of the process of bit allocation modification in accordance with the invention.

As shown in FIG. 3, the bit allocation modification process of the step 205c specifically comprises the following steps:

step 301, calculating the number of bits saved by the Huffman coding diff_huff letting count=0:

$$\text{diff\_huff}=\text{sum}(\text{bit\_band\_used}(j), j \in C)-\text{bit\_used\_huff\_all}.$$

If diff_huff is greater than 0, it represents that the Huffman coding can save bits, and the number of bits saved by the Huffman coding is the number of bits which can be used when the bit allocation modification is performed on the coding sub-band.

Step 302, finding the coding sub-band with a maximum importance in all the coding sub-bands;

finding the maximum value $rk(j_k)$ in each $rk(j)$ ($j=0, \ldots, L-1$), which is represented in the equation:

$$j_k = \underset{j=0,\ldots,L-1}{\operatorname{argmax}} [rk(j)]$$

Step 303, judging whether the number of the allocated bits of the coding sub-band with the maximum importance plus 1 (region_bit($j_k$)+1) is less than or equal to the maximum number of the coded bits which can be allocated to one frequency domain coefficient in the coding sub-band MaxBit (for example, MaxBit=9), if yes, proceeding to step 304, or else, adjusting the importance of the coding sub-band corresponding to $j_k$ to the lowest (for example, letting $rk(j_k)=-100$), which represents that the bit allocation value of the coding sub-band is not needed to modify, and then turning to step 302.

If the number of bits allocated to the coding sub-band with the maximum importance has reached the maximum value of number of the bits which can be allocated, the importance of the coding sub-band is adjusted to the lowest, and the bit allocation value is not modified for the coding sub-band.

Step 304, judging whether diff_huff−(region_bit($j_k$)+1)× BandWidth($j_k$) is greater than or equal to 0, if yes, indicating that the number of the saved bits is enough for performing the bit allocation modification on the coding sub-band, and proceeding to step 305; or else, ending the bit allocation modification process.

Step 305, judging whether the number of allocated bits region_bit($j_k$) is equal to 0, or greater than or equal to threshold 5, if yes, proceeding to step 306, or else, proceeding to step 307.

Step 306, modifying the number of bits allocated to the coding sub-band $j_k$ region_bit($j_k$) to make region_bit($j_k$)=region_bit($j_k$)+1, reducing the value of the importance of the sub-band $rk(j_k)$ to make $rk(j_k)=rk(j_k)-1$; letting the number of bit allocation modification iteration count=count+1, and performing vector quantization and Huffman coding again on the coding sub-band $j_k$ and updating the value of diff_huff at last.

Step 307, modifying the number of bits allocated to the coding sub-band $j_k$ region_bit($j_k$) to make region_bit($j_k$)=region_bit($j_k$)+0.5; reducing the value of the importance of the sub-band $rk(j_k)$ to make $rk(j_k)$=$rk(j_k)$−0.5; letting count=count+1, and performing vector quantization and Huffman coding again on the coding sub-band $j_k$ and updating the value of diff_huff at last.

Vector quantization and coding are performed again on the coding sub-band for which the bit allocation has been modified, and if the Huffman coding still saves more bits than the natural coding, the saved bits are further used for the bit allocation modification of the coding sub-band.

Step 308, judging whether the number of bit allocation modification iterations count is less than Maxcount, if yes, jumping to step 302, or else, ending the bit allocation modification process.

The above Maxcount is the upper limit value of the number of bit allocation modification iterations, which is determined by the coded bit stream and the sampling rate thereof. In the example, Maxcount=31 is used.

Step 206, the vector quantization index of the high bit coding sub-band is coded.

The number of bits allocated to the high bit coding sub-band j satisfies:
5<=region_bit(j)<=9.

The index vector k={k1, k2, k3, k4, k5, k6, k7, k8} is obtained after the 8-dimension vector in the coding sub-band whose number of coded bits is 5 to 9 is quantized, each component of the index vector k is coded directly according to the number of bits allocated to one frequency domain coefficient to obtain the coded bits of the vector.

It can be seen from the statistical result that, under the condition of 32 kHz sampling rate and 32 kbps code rate, 96% of all the coding sub-bands are coding sub-bands with the number of allocated bits being less than 5. That is to say, the possibility of using the pyramid lattice vector quantization is 96% in the whole vector quantization. The pyramid lattice vector quantization plays a very important role in the invention and uses a step length variable bit allocation for bit allocation, wherein, the bit allocation step length of one frequency domain coefficient may be adjusted minimally to half a bit, thus improving the efficiency of bit usage. The lattice point label algorithm for the pyramid lattice vector quantization method of the low bit step length in the invention has a low complexity and occupies little storage space. In addition, a new judging rule is used for the code book extension label in the sphere lattice vector quantization of the high bit coding sub-band, thus further reducing the complexity of the lattice vector quantization method.

2. Decoding Method

The audio decoding method of lattice vector quantization in the invention is the inverse process of the coding method, comprising:

A. decoding the coded bits of each amplitude envelope in a to-be-decoded bit steam to obtain an amplitude envelope quantization exponent of each coding sub-band;

B. performing bit allocation on each coding sub-band, dividing the coding sub-bands into a low bit coding sub-band and a high bit coding sub-band according to the number of the allocated bits of each coding sub-band, performing decoding, inverse quantization and inverse normalization of pyramid lattice vector quantization on the low bit coding sub-band, and performing decoding, inverse quantization and inverse normalization of sphere lattice vector quantization on the high bit coding sub-band, and obtaining frequency domain coefficients of the low bit coding sub-band and the high bit coding sub-band; wherein, the low bit coding sub-band is a coding sub-band in which the number of bits allocated to one frequency domain coefficient is less than a preset threshold value, the high bit coding sub-band is a coding sub-band in which the number of bits allocated to one frequency domain coefficient is greater than or equal to a preset threshold value;

before the step of performing bit allocation on each coding sub-band, firstly calculating an initial value of importance of each coding sub-band according to the amplitude envelope value of the coding sub-band, and then performing bit allocation on each frequency domain coefficient in the coding sub-band according to the importance of each coding sub-band, and during the bit allocation, bit allocation step length and importance-reduction step length after the bit allocation are both variable. After the bit allocation is performed and before the decoding, the bit allocation modification is performed on the coding sub-band for count times again according to a value of the number of bit allocation modification iterations count and importance of each coding sub-band at a coding side.

When the low bit coding sub-band is decoded, the Huffman coding or direct decoding is performed on the low bit coding sub-band according to the frequency domain coefficient Huffman coding flag at the coding side to obtain the vector quantization index of the low bit coding sub-band, and the inverse quantization of the pyramid lattice vector quantization is performed on all the vector quantization indexes to obtain the frequency domain coefficient of the coding sub-band; when the high bit coding sub-band is decoded, the high bit coding sub-band is directly naturally decoded to obtain the vector quantization index of the high bit coding sub-band, and the inverse quantization of the sphere lattice vector quantization is performed on all the vector quantization indexes to obtain the frequency domain coefficient of the coding sub-band.

C. performing an inverse modified discrete cosine transform (IMDCT) on the frequency coefficient after a noise filling to obtain a final audio signal.

Figure 4:
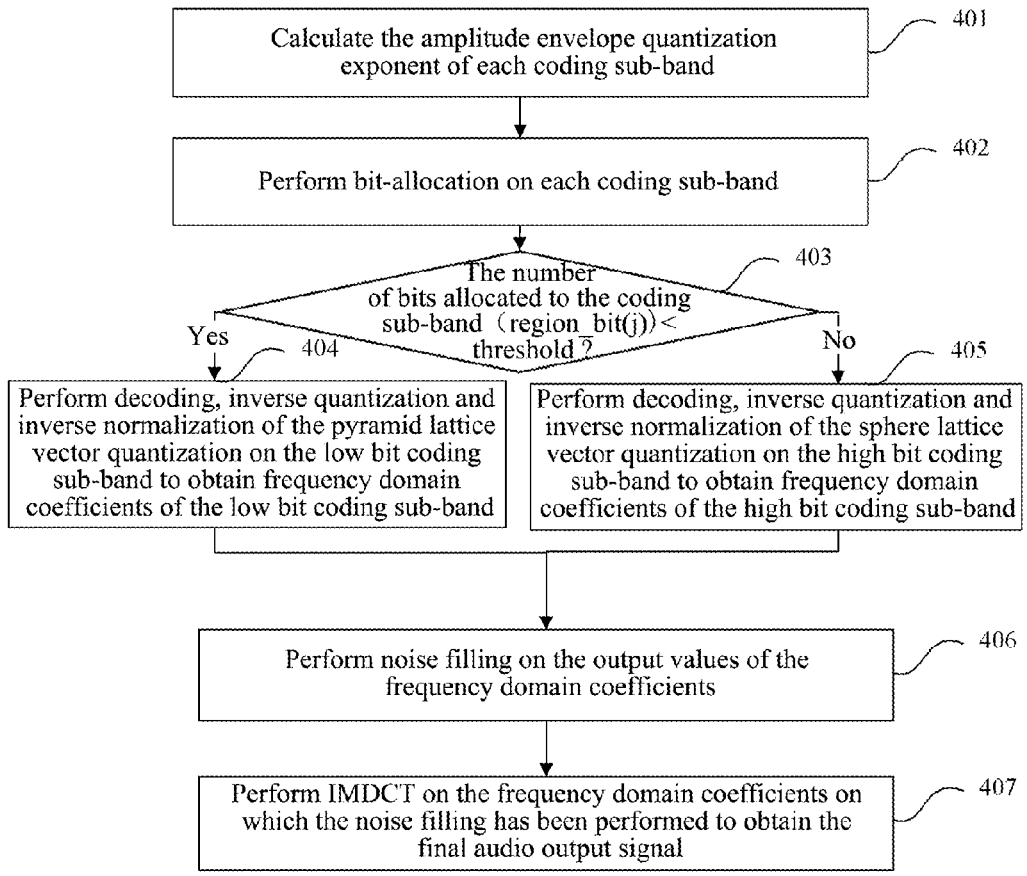
FIG. 4 is a schematic diagram of the audio decoding method of lattice vector quantization in accordance with the invention.

FIG. 4 is a structure schematic diagram of the audio decoding method of lattice vector quantization in accordance with the example of the invention. As shown in FIG. 4, the method comprises the following steps.

Step 401, the coded bits of each amplitude envelope are decoded to obtain the amplitude envelope quantization exponent of each coding sub-band.

A frame of coded bits are extracted from the coded bit stream sent from the coding side (i.e. from the bit stream demultiplexer DeMUX); after the coded bits are extracted, the side information is firstly decoded, and then the coded bits of each amplitude envelope in the frame is Huffman decoded or directly decoded according to the value of the amplitude envelope Huffman coding flag Flag_huff_rms to obtain the amplitude envelope quantization exponent of each coding sub-band $Th_q(j)$, j=0, . . . , L−1.

Step 402, bit allocation is performed on each coding sub-band.

The initial value of importance of each coding sub-band is calculated according to the amplitude envelope quantization exponent of each coding sub-band, and the importance of the coding sub-band is used to perform bit allocation on each coding sub-band to obtain the number of bits allocated to the coding sub-band; the bit allocation s at the decoding side and at the coding side are the same. During the bit allocation, the bit allocation step length and the importance-reduction step length of the coding sub-band after the bit allocation are both variable.

After the above bit allocation process is completed, the bit allocation modification is performed on the coding sub-band for count times again according to the value of the number of bit allocation modification iterations count and the importance of each coding sub-band at the coding side, and then the bit allocation process is over.

During the bit allocation and modification progress, the bit allocation step length and the bit allocation modification step length are both 1 bit when the bits are allocated to the coding sub-band with the number of allocated bits being 0, and the importance-reduction step length after the bit allocation and the bit allocation modification is 1. The bit allocation step length and the bit allocation modification step length are both 0.5 bit when bits are allocated additionally to the coding sub-band with the number of allocated bits being greater than 0 and less than a certain threshold value, and the importance-reduction step length after the bit allocation and the bit allocation modification is also 0.5. The bit allocation step length and the bit allocation modification step length are both 1 bit when bits are allocated additionally to the coding sub-band with the number of allocated bits being greater than or equal to the threshold value, and the importance-reduction step length after the bit allocation and the bit allocation modification is also 1.

Step 403, all the coding sub-bands are divided into low bit coding sub-bands and high bit coding sub-bands according to the number of bits allocated to the coding sub-bands, i.e. it is judged whether the number of bits allocated to the coding sub-band j region_bit(j) is less than a preset threshold value, if yes, the coding sub-band is a low bit coding sub-band, proceeding to step 404, or else, the coding sub-band is a high bit coding sub-band, proceeding to step 405.

Step 404, the low bit coding sub-band is decoded to obtain the index of the pyramid lattice vector quantization, and the $D_8$ lattice point corresponding to the index of the pyramid lattice vector quantization is calculated, and the frequency domain coefficient of the low bit coding sub-band is obtained after the inverse normalization is performed; proceeding to step 406.

Huffman decoding or direct natural decoding is performed on the low bit coding sub-band according to the side information to obtain the index of the pyramid lattice vector quantization of the low bit coding sub-band.

If Flag_huff_plvq=0, the natural decoding is directly performed to obtain the index of the $m^{th}$ vector quantization of the low bit coding sub-band j index_b(j,m); if Flag_huff_plvq=1, the index of the $m^{th}$ vector quantization of the low bit coding sub-band j index_b(j,m) is obtained according to the Huffman coding code table corresponding to the number of bits allocated to one frequency domain coefficient of the coding sub-band.

When the number of bits allocated to one frequency domain coefficient of the coding sub-band is 1, if a value of the natural binary code value of the quantization index is less than "1111 111", then the quantization index is calculated according to the value of the natural binary code; if the value of the natural binary code of the quantization index is equal to "1111 111", then next bit is continuously read in, if the next bit is 0, then the quantization index value is 127, if the next bit is 1, then the quantization index value is 128.

The process of calculating the $D_8$ lattice point corresponding to the index of the pyramid lattice vector quantization is actually the inverse process of the vector quantization process, and the inverse quantization process of the pyramid lattice vector quantization is as follows:

Step 404a), the energy pyramid surface where the vector quantization index is located and the label on the energy pyramid surface are determined:

seeking a kk in the pyramid surface energy from 2 to LargeK(region_bit(j)) to meet the below inequality:

$$N(8,kk) \le \text{index\_}b(j,m) < N(8,kk+2),$$

if such a kk is found, then K=kk is the energy of the pyramid surface where the $D_8$ lattice point corresponding to the quantization index index_b(j,m) is located, b=index_b(j,m)−N(8,kk) is the index label of the $D_8$ lattice point on the pyramid surface.

if such a kk is not found, the pyramid surface energy of the $D_8$ lattice point corresponding to the quantization index index_b(j,m) K=0 and the index label b=0.

step 404b), the specific procedures for solving the $D_8$ lattice point vector Y=(y1, y2 y3, y4, y5, y6, y7, y8,) whose pyramid surface energy is K and index label is b are as follows:

step 1, letting Y=(0,0,0,0,0,0,0,0), xb=0, i=1, k=K, l=8;
step 2, if b=xb then yi=0; jumping to step 6;
step 3, if b<xb+N(l−1,k), then yi=0, and jumping to step 5; or else, xb=xb+N(l−1,k); letting j=1;
step 4, if b<xb+2*N(l−1,k−j), then
 if xb<=b<xb+N(l−1,k−j), then yi=j;
 if b>=xb+N(l−1,k−j), then yi=−j, xb=xb+N(l−1, k−j);
  or else, xb=xb+2*N(l−1, k−j), j=j+1; continuing the step;
step 5, updating k=k−|yi|, l=l−1, i=i+1, if k>0, then jumping to step 2;
step 6, if k>0, then y8=k−|yi|, Y=(y1, y2, ... , y8) is the solved lattice point.

Step 404c) the energy inverse regulation is performed on the solved $D_8$ lattice point to obtain $$\overline{Y}_j^m = (Y+a)/\text{scale(index)}$$

wherein, a=$(2^{-6}, 2^{-6}, 2^{-6}, 2^{-6}, 2^{-6}, 2^{-6}, 2^{-6}, 2^{-6})$, scale(index) is a scaling factor, which may be found in table 2.

Step 404d), the inverse normalization processing is performed on $\underline{Y}_j^m$ to obtain the frequency domain coefficient of the $m^{th}$ vector in the coding sub-band j recovered by the decoding side:

$$\overline{X}_j^m = 2^{Th_q(j)/2} \cdot \overline{Y}_j^m$$

wherein, $Th_q(j)$ is an amplitude envelope quantization exponent of the $j^{th}$ coding sub-band.

Step 405, a decoding, an inverse quantization and an inverse normalization of the sphere lattice vector quantization are performed on the high bit coding sub-band to obtain the frequency domain coefficients of the high bit coding sub-band.

The natural decoding is directly performed on the coded bits of the high bit coding sub-band to obtain the $m^{th}$ index vector k of the high bit coded bit j. The process of performing the inverse quantization of the sphere lattice vector quantization on the index vector is actually the inverse process of the quantization process, the specific steps are as follows:

step 405a), calculating x=k*G and calculating ytemp=x/(2^(region_bit(j))); wherein, k is the index vector of the vector quantization, region_bit(j) represents the number of bits allocated to one frequency domain coefficient in the coding sub-band j; G is the generator matrix of the $D_8$ lattice point and the form is as follows:

$$G = \begin{bmatrix} 2 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 0 & 0 & 1 & 0 & 0 & 0 & 0 \\ 1 & 0 & 0 & 0 & 1 & 0 & 0 & 0 \\ 1 & 0 & 0 & 0 & 0 & 1 & 0 & 0 \\ 1 & 0 & 0 & 0 & 0 & 0 & 1 & 0 \\ 1 & 0 & 0 & 0 & 0 & 0 & 0 & 1 \end{bmatrix}$$

step 405b), calculating y=x−f$_{D_8}$(ytemp)*(2^(region_bit(j)));

step 405c), performing energy inverse regulation on the solved $D_8$ lattice point to obtain $$\overline{Y}_j^m = y * \text{scale(region\_bit}(j))/(2^{region\_bit(j)}) + a$$

wherein, $a = (2^{-6}, 2^{-6}, 2^{-6}, 2^{-6}, 2^{-6}, 2^{-6}, 2^{-6}, 2^{-6})$, scale(region_bit(j)) is th scaling factor and may be found in table 3.

step 405d), performing inverse normalization processing on $\overline{Y}_j^m$ to obtain the frequency domain coefficient of the $m^{th}$ vector in the coding sub-band j recovered by the decoding side:

$$\overline{X}_j^m = 2^{Th_q(j)/2} \cdot \overline{Y}_j^m$$

wherein, $Th_q(j)$ is an amplitude envelope quantization exponent of the $j^{th}$ coding sub-band.

Step 406, the frequency domain coefficients of all the coding sub-bands are sequenced according to the amplitude of the frequency, and noise filling and bandwidth extension are performed on the sub-bands with no allocated coded bits in the coding process or the sub-bands lost in the transmission process.

Step 407, IMDCT (Inverse Modified Discrete Cosine Transform) is performed on the frequency domain coefficient after the noise filling and the bandwidth extension is performed to obtain the final output audio signal.

3. Encoding System

Figure 5:
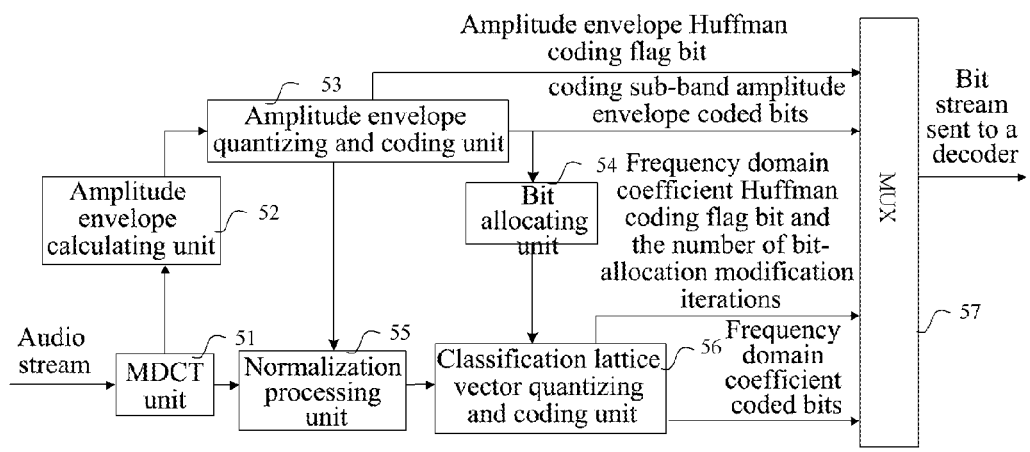
FIG. 5 is a schematic diagram of the structure of the audio coding system of lattice vector quantization in accordance with the invention.

To implement the above coding method, the invention further provides an audio coding system of lattice vector quantization, as shown in FIG. 5, the system comprises a modified discrete cosine transform (MDCT) unit 51, an amplitude envelope calculating unit 52, an amplitude envelope quantizing and coding unit 53, a bit allocating unit 54, a normalization processing unit 55, a classification lattice vector quantizing and coding unit 56 and a bit stream multiplexer (MUX) 57. Wherein, MDCT unit is configured to perform the MDCT on an audio signal to generate frequency domain coefficients;

the amplitude envelope calculating unit is connected to the MDCT unit and is configured to divide the frequency domain coefficients generated by the MDCT unit into several coding sub-bands, and calculate an amplitude envelope value of each coding sub-band;

when dividing the coding sub-band, the amplitude envelope calculating unit divides the frequency domain coefficients after the MDCT into several equally spaced coding sub-bands, or divides them into several non-uniform coding sub-bands according to the auditory perception characteristic.

The amplitude envelope quantizing and coding unit is connected to the amplitude envelope calculating unit and is configured to quantize and code the amplitude envelope value of each coding sub-band to generate the coded bits of the amplitude envelope of each coding sub-band.

The bit allocating unit is connected to the amplitude envelope quantizing and coding unit and is configured to perform bit allocation to obtain the number of the coded bits allocated to each frequency domain coefficient in each coding sub-band.

Specifically, the bit allocating unit comprises an importance calculating module and a bit allocating module connected to each other, wherein, the importance calculating module is configured to calculate an initial value of importance of each coding sub-band according to the amplitude envelope value of the coding sub-band;

the bit allocating module is configured to perform bit allocation on each frequency domain coefficient in each coding sub-band according to the importance of each coding sub-band, wherein, during the bit allocation, the bit allocation step length and the importance-reduction step length after the bit allocation are both variable.

The initial value of the importance is calculated according to an optimal bit value under the maximum quantization signal to noise gain condition and a scaling factor complying with the auditory perception characteristic, or is the quantization exponent $Th_q(j)$ or $\lfloor \mu \times \log_2[Th(j)] + v \rfloor$ of each coding sub-band amplitude envelope, wherein, $\mu > 0$, and $\mu$ and $v$ are both real numbers.

The importance calculating module is configured to, when calculating the initial value of the importance, firstly calculate a bit consumption average value of one frequency domain coefficient; then calculate an optimal bit value under the maximum quantization signal to noise gain condition according to a code rate distortion theory; then calculate the initial value of importance of each coding sub-band in bit allocation according to the bit consumption average value and the optimal bit value;

the bit allocating module is configured to perform bit allocation on each coding sub-band according to the importance of each coding sub-band, increase the number of the coded bits of each frequency domain coefficient in the coding sub-band with the maximum importance, and decrease the importance of the coding sub-band till the sum of the numbers of bits consumed by all the coding sub-bands meets the maximum value under the condition of the bit limitation.

When the bit allocating module performs the bit allocation, the bit allocation step length and the importance-reduction step length after the bit allocation of the low bit coding sub-band are less than the bit allocation step length and the importance-reduction step length after the bit allocation of the zero bit coding sub-band and high bit coding sub-band. For example, when the bit allocating module performs the bit allocation, the bit allocation step length and the importance-reduction step length after the bit allocation of the low bit coding sub-band are both 0.5; the bit allocation step length and the importance-reduction step length after the bit allocation of the zero bit coding sub-band and high bit coding sub-band are both 1.

The normalization processing unit is connected to the MDCT unit and is configured to use the quantization amplitude envelope value of the coding sub-band to perform normalization processing on all the frequency domain coefficients in each coding sub-band.

The classification lattice vector quantizing and coding unit is connected to the normalization processing unit and the bit allocating unit and is configured to perform quantization and coding on the normalized to-be-quantized vectors in a low bit coding sub-band and a high bit coding sub-band respectively in a pyramid lattice vector quantization and a sphere lattice vector quantization to obtain the coded bits of the frequency domain coefficient; wherein, the low bit coding sub-band is a coding sub-band in which the number of bits allocated to one frequency domain coefficient is less than a preset threshold value, the high bit coding sub-band is a coding sub-band in which the number of bits allocated to one frequency domain coefficient is greater than or equal to a preset threshold value.

The bit stream multiplexer (MUX) is connected to the amplitude envelope quantizing and coding unit and the classification lattice vector quantizing and coding unit and is configured to multiplex the coded bits of each coding sub-band and the coded bits of the frequency domain coefficients and send them to a decoding side.

Figure 6:
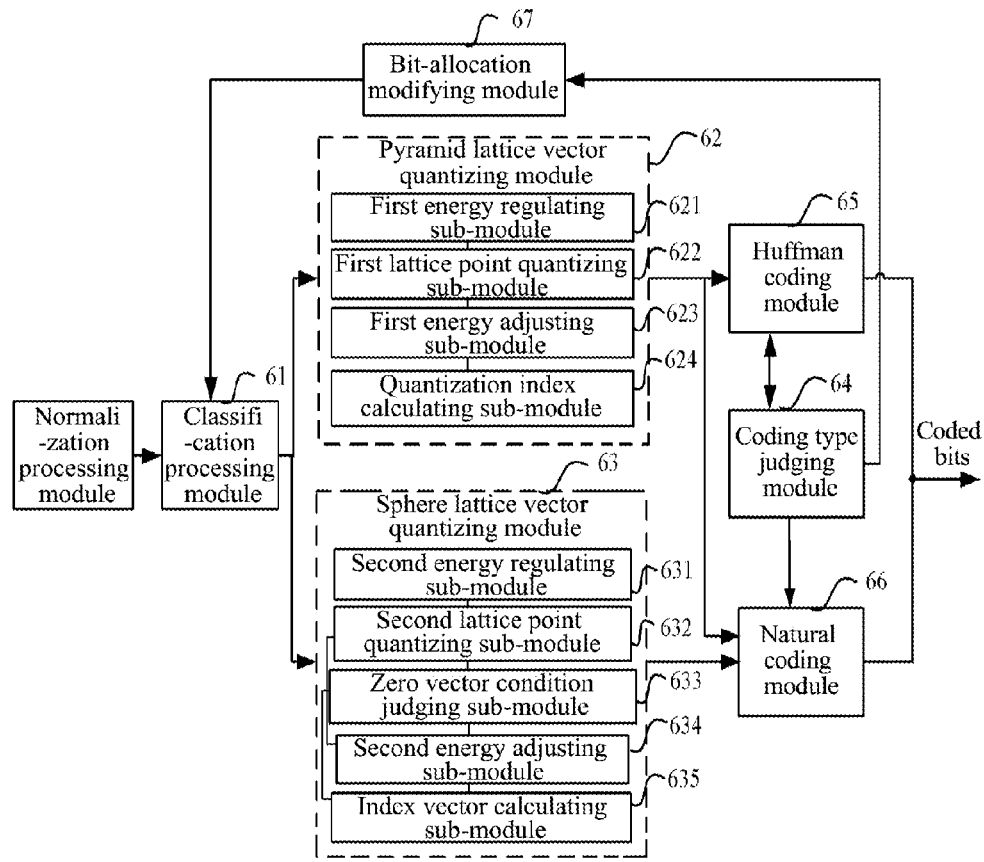
FIG. 6 is a schematic diagram of the structure of the modules of the classification lattice vector quantizing and coding unit of the coding system in accordance with the invention.

The classification lattice vector quantizing and coding unit is described in detail with reference to FIG. 6:

as shown in FIG. 6, the classification lattice vector quantizing and coding unit comprises a classification processing module 61, a pyramid lattice vector quantizing module 62, a sphere lattice vector quantizing module 63, a coding type judging module 64, a Huffman coding module 65, a natural coding module 66 and a bit allocation modifying module 67, wherein, the classification processing module is connected to the normalization processing unit and is configured to group the normalized frequency domain coefficients to form a 8-dimension to-be-quantized vector, and forward the normalized to-be-quantized vector of the low bit coding sub-band to the pyramid lattice vector quantizing module and forward the normalized to-be-quantized vector of the high bit coding sub-band to the sphere lattice vector quantizing module to process;

the pyramid lattice vector quantizing module is connected to the classification processing module and configured to perform the pyramid lattice vector quantization on the normalized to-be-quantized vector of each low bit coding sub-band; the pyramid lattice vector quantizing module comprises a first energy regulating sub-module 621, a first lattice point quantizing sub-module 622, a first energy adjusting sub-module 623 and a quantization index calculating sub-module 624, wherein, the first energy regulating sub-module is configured to perform the energy regulation on a 8-dimension to-be-quantized vector in the coding sub-band;

the first energy regulating sub-module is further configured to, when performing the energy regulation on the 8-dimension to-be-quantized vector, firstly search the previous table 2 for a code book sequence number index and a energy scaling factor scale corresponding to the number of bits according to the number of bits region_bit(j) allocated to one frequency domain coefficient in the coding sub-band j where the 8-dimension to-be-quantized vector is located; then perform the energy regulation on the to-be-quantized vector according to a following equation:

$$\tilde{Y}_{j,scale}{}^m = (Y_j{}^m - a) * \text{scale(index)}$$

wherein, $Y_j{}^m$ represents the $m^{th}$ normalized 8-dimension to-be-quantized vector in the coding sub-band j, $\tilde{Y}_{j,scale}{}^m$ represents a 8-dimension vector after performing the energy regulation on $Y_j{}^m$ $a=(2^{-6}, 2^{-6}, 2^{-6}, 2^{-6}, 2^{-6}, 2^{-6}, 2^{-6}, 2^{-6})$;

the first lattice point quantizing sub-module is connected to the first energy regulating sub-module and is configured to quantize the 8-dimension to-be-quantized vector to a $D_8$ lattice point;

when performing lattice point quantization, the first lattice point quantizing sub-module quantizes the 8-dimension vector $\tilde{Y}_{j,scale}{}^m$ to the $D_8$ lattice point $\hat{Y}_j{}^m$ with a following equation:

$$\hat{Y}_j{}^m = f_{D_8}(\tilde{Y}_{j,scale}{}^m)$$

wherein, $f_{D_8}(\bullet)$ represents a quantizing operator for mapping a certain 8-dimension vector to the $D_8$ lattice point;

the first energy adjusting sub-module is connected to the first lattice point quantizing sub-module and is configured to compare the energy of the $D_8$ lattice point with a maximum pyramid surface energy radius in the coding code book, if the energy of the $D_8$ lattice point is less than or equal to the maximum pyramid surface energy radius, notify the quantization index calculating sub-module to calculate a quantization index of the $D_8$ lattice point in the code book; if the energy of the $D_8$ lattice point is greater than the maximum pyramid surface energy radius, perform an energy truncation on the regulated to-be-quantized vector in the coding sub-band, and notify the first lattice point quantizing sub-module to quantize the energy-trunked to-be-quantized vector to the $D_8$ lattice point till the energy of the quantization lattice point of the energy-trunked to-be-quantized vector is not greater than the maximum pyramid surface energy radius, and meanwhile continuously add an energy to the energy-trunked to-be-quantized vector, and notify the first lattice point quantizing sub-module to quantize the energy-added to-be-quantized vector to the $D_8$ lattice point till the energy of the $D_8$ lattice point to which the energy-added to-be-quantized vector is quantized is more than the maximum pyramid surface energy radius, and notify the quantization index calculating sub-module to calculate the quantization index of the last $D_8$ lattice point whose energy is not more than the maximum pyramid surface energy radius in the code book;

the quantization index calculating module is connected to the first energy adjusting sub-module and is configured to calculate the quantization index of the $D_8$ lattice point in the code book according to the notification of the first energy adjusting sub-module.

The quantization index calculating sub-module is configured to, when calculating the quantization index of the $D_8$ lattice point $\hat{Y}_j{}^m$ in the code book, label the lattice points on each pyramid surface respectively according to the amplitude of the pyramid surface energy, then label uniformly the lattice point on all the pyramid surfaces, wherein, the uniform label is the quantization index of the $D_8$ lattice point $\hat{Y}_j{}^m$ in the code book.

The sphere lattice vector quantizing module is connected to the classification processing module and is configured to perform sphere lattice vector quantization on the normalized to-be-quantized vector in the high bit coding sub-band; the sphere lattice vector quantizing module comprises a second energy regulating sub-module 631, a second lattice point quantizing sub-module 632, a zero vector condition judging sub-module 633, a second energy adjusting sub-module 634 and an index vector calculating sub-module 635, wherein, the second energy regulating sub-module is configured to perform the energy regulation on the 8-dimension to-be-quantized vector in the coding sub-band;

when performing the energy regulation on the 8-dimension to-be-quantized vector, the second energy regulating sub-module firstly searches for an energy scaling factor scale (region_bit(j)) corresponding to the number of bits according to the number of bits region_bit(j) allocated to one frequency domain coefficient in the coding sub-band j where the to-be-quantized vector $Y_j{}^m$ is located; then performs the energy regulation on the $m^{th}$ to-be-quantized vector $Y_j{}^m$ according to a following equation:

$$\hat{Y}_j{}^m = \beta(Y_j{}^m - a)$$

wherein, $Y_j{}^m$ represents the $m^{th}$ normalized 8-dimension to-be-quantized vector in the coding sub-band j, $a=(2^{-6}, 2^{-6}, 2^{-6}, 2^{-6}, 2^{-6}, 2^{-6}, 2^{-6}, 2^{-6})$, $$\beta = \frac{2^{region\_bit(j)}}{scale(region\_bit(j))},$$

and scale(region_bit(j)) represents the energy scaling factor when the number of bits allocated to one frequency domain coefficient in the coding sub-band is region_bit(j), and the corresponding relationship may be found based on table 3;

the second lattice point quantizing sub-module is connected to the second energy regulating sub-module and is configured to quantize the 8-dimension to-be-quantized vector to the $D_8$ lattice point;

the second lattice point quantizing sub-module maps the $m^{th}$ to-be-quantized vector $\tilde{Y}_j^m$ in the coding sub-band j to the $D_8$ lattice point $\tilde{Y}_j^m$ with the following equation:

$$\tilde{Y}_j^m f_{D_8}(\tilde{Y}_j^m);$$

the zero vector condition judging sub-module is connected to the second lattice point quantizing sub-module and is configured to judge whether the $D_8$ lattice point meets the zero vector condition, if yes, notify the index vector calculating sub-module to calculate the index vector of the $D_8$ lattice point; if not, notify the second energy adjusting sub-module to adjust the energy of the to-be-quantized vector; the zero vector condition is to divide the $D_8$ lattice point value obtained by vector quantization by 2 to a power of the number of allocated bits $2^{region\_bit(j)}$, and then project to the $D_8$ lattice point, the projected $D_8$ lattice point value is a zero vector, wherein, region_bit(j) represents the number of bits allocated to one frequency domain coefficient in the $j^{th}$ coding sub-band;

the second energy adjusting sub-module is connected to the zero vector condition judging sub-module and the second lattice point quantizing sub-module and is configured to perform energy truncation on a value of the to-be-quantized vector, and notify the second lattice point quantizing sub-module to quantize the energy-trunked to-be-quantized vector to the $D_8$ lattice point till the zero vector condition is satisfied; and to back up a multiple value w of the to-be-quantized vector itself, and add the backup multiple value w to the energy-trunked to-be-quantized vector, and notify the second lattice point quantizing sub-module to quantize the energy-trunked to-be-quantized vector to the $D_8$ lattice point till the zero vector condition is not satisfied; and to notify the index vector calculating sub-module to calculate a latest index vector of the $D_8$ lattice point meeting the zero vector condition;

the index vector calculating sub-module is connected to the zero vector condition judging sub-module and the second energy adjusting sub-module and is configured to calculate the quantization index of the $D_8$ lattice point in the code book according to notifications from the zero vector condition judging sub-module and the second energy adjusting sub-module.

The index vector calculating sub-module calculates the vector quantization index vector k of the $m^{th}$ vector quantized to the $D_8$ lattice point $\tilde{Y}_j^m$ in the $j^{th}$ coding sub-band according to the following equation:

$$k = (\tilde{Y}_j^m G^{-1}) \mod 2^{region\_bit(j)}$$

wherein, region_bit(j) represents the number of bits allocated to one frequency domain coefficient in the coding sub-band j; G is the generator matrix of the $D_8$ lattice point and the form is as follows:

$$G = \begin{bmatrix} 2 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 0 & 0 & 1 & 0 & 0 & 0 & 0 \\ 1 & 0 & 0 & 0 & 1 & 0 & 0 & 0 \\ 1 & 0 & 0 & 0 & 0 & 1 & 0 & 0 \\ 1 & 0 & 0 & 0 & 0 & 0 & 1 & 0 \\ 1 & 0 & 0 & 0 & 0 & 0 & 0 & 1 \end{bmatrix}$$

The coding type judging module is connected to the pyramid lattice vector quantizing module and is configured to judge whether a total number of consumed bits of the Huffman coded quantization indexes of all the low bit coding sub-bands is less than a total number of bits needed for naturally coding the quantization indexes of all the low bit coding sub-bands, if yes, notify the Huffman coding module and bit allocation modifying module; or else, notify the natural coding module.

The Huffman coding module is configured to perform the Huffman coding on the quantization index of the low bit coding sub-band, and set a frequency domain coefficient Huffman coding flag to be that the Huffman coding has been used.

When the Huffman coding module performs Huffman coding on the quantization indexes of all the low bit coding sub-bands, in all the coding sub-bands in which the number of bits allocated to one frequency domain coefficient is greater than 1, less than 5 and not 2, each four-bits in the natural binary codes for each vector quantization index are divided into one group and the Huffman coding is performed on that group, and the sum of the numbers of bits of the Huffman coding for all the 4-bits groups is the number of bits consumed in the Huffman coding of the quantization index;

in all the coding sub-bands in which the number of bits allocated to one frequency domain coefficient is 2, 15 bits are used for coding the pyramid lattice vector quantization index of each 8-dimension vector, and the 15 bits are divided into 3 4-bits groups and 1 3-bits group, then the Huffman coding is performed on the groups, the sum of the numbers of bits of the 4 groups consumed in Huffman coding is the number of bits consumed in the Huffman coding of the quantization index;

when the number of bits allocated to one frequency domain coefficient of the coding sub-band is 1, if the quantization index is less than 127, then the quantization index is coded with 7 bits, which are divided into 1 3-bits group and 1 4-bits group, the Huffman coding is performed respectively on the two groups, the sum of the numbers of bits of the two groups consumed in Huffman coding is the number of bits consumed in the Huffman coding of the quantization index;

when the number of bits allocated to one frequency domain coefficient of the coding sub-band is 1, if the quantization index is equal to 127, then its own natural binary code is defined as "1111 1110", 7 1s in front are divided into 1 3-bits group and 1 4-bits group, the Huffman coding is performed respectively on the two groups, the sum of the numbers of bits of the two groups consumed in Huffman coding is the number of bits consumed in the Huffman coding of the quantization index;

when the number of bits allocated to one frequency domain coefficient of the coding sub-band is 1, if the quantization index is equal to 128, then its own natural binary code is defined as "1111 1111", 7 1s in front are divided into 1 3-bits group and 1 4-bits group, the Huffman coding is performed respectively on the two groups, the sum of the numbers of bits of the two groups consumed in Huffman coding is the number of bits consumed in the Huffman coding of the quantization index.

When the Huffman coding is performed on the quantization indexes of all the low bit coding sub-bands, different code books are used to code the vector quantization index of the coding sub-band according to the number of bits allocated to one frequency domain coefficient in the coding sub-band.

The natural coding module is configured to perform the natural coding on the quantization index of the low bit coding sub-band and the index vector of the high bit coding sub-band.

The bit allocation modifying module is configured to use bits saved by the Huffman coding to modify the number of allocated bits of the coding sub-band, and notify the classification processing module to perform vector quantization and coding again after classifying the coding sub-bands for which the bit allocation has been modified.

When performing bit allocation, the bit allocation modifying module searches for a coding sub-band with a maximum importance in all the coding sub-bands, if the number of bits allocated to the coding sub-band has reached the maximum value of the number of the bits possibly allocated, adjust the importance of the coding sub-band to be the lowest, and not modify the number of allocated bits for the coding sub-band any more, or else, perform bit allocation modification on the coding sub-band with the maximum importance;

during the bit allocation modification, the bit allocation modifying module allocates 1 bit to the coding sub-band with the number of allocated bits being 0, and reduces the importance by 1 after the bit allocation is performed; allocates 0.5 bit to the coding sub-band with the number of allocated bits being greater than 0 and less than 5, and reduces the importance by 0.5 after the bit allocation is performed; allocates 1 bit to the coding sub-band with the number of allocated bits being greater than 5, and reduces the importance by 1 after the bit allocation is performed.

After each time the number of allocated bits is modified by the bit allocation modifying module, a bit allocation modification iteration number count is added by 1, if the number of bit allocation modification iterations count has reached a preset upper limit or the number of bits which can be used is less than the number of bits needed for the bit allocation modification, the process of the bit allocation modification is ended.

The order for the bit stream multiplexer multiplexing and packing the coded bits is in sequence of an amplitude envelope Huffman coding flag, a frequency domain coefficient Huffman coding flag, the number of bit allocation modification iterations, a coded bit of an amplitude envelope, a coded bit of the frequency domain coefficient.

4. Decoding System

Figure 7:
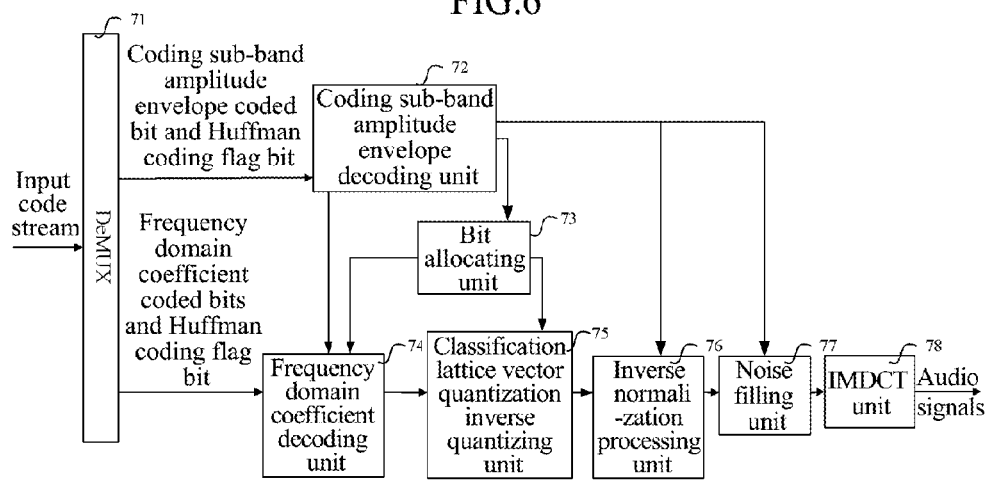
FIG. 7 is a schematic diagram of the structure of the audio decoding system of lattice vector quantization in accordance with the invention.

To implement the above decoding method, the invention further provides an audio decoding system of lattice vector quantization, as shown in FIG. 7, the system comprises a bit stream demultiplexer (DeMUX) 71, a coding sub-band amplitude envelope decoding unit 72, a bit allocating unit 73, a frequency domain coefficient decoding unit 74, a classification lattice vector quantization inverse quantizing unit 75, an inverse normalization processing unit 76, a noise filling unit 77 and an inverse modified discrete cosine transform (IMDCT) unit 78, wherein, the bit stream demultiplexer (DeMUX) is configured to separate side information, an amplitude envelope coded bit and a frequency domain coefficient coded bit from a to-be-decoded bit stream;

the amplitude envelope decoding unit is connected to the bit stream demultiplexer and is configured to decode the coded bit of the amplitude envelope output by the bit stream demultiplexer to obtain the amplitude envelope quantization exponent of each coding sub-band;

the bit allocating unit is connected to the coding sub-band amplitude envelope decoding unit and is configured to perform bit allocation to obtain the number of coded bits allocated to each frequency domain coefficient in each coding sub-band;

the bit allocating unit comprises an importance calculating module and a bit allocating module and a bit allocation modifying module, wherein, the importance calculating module is configured to calculate an initial value of the importance of each coding sub-band according to the coding sub-band amplitude envelope value;

the bit allocating module is configured to perform bit allocation on each frequency domain coefficient in each coding sub-band according to the initial value of the importance of each coding sub-band, wherein, during the bit allocation, bit allocation step length and importance-reduction step length after the bit allocation are both variable;

the bit allocation modifying module is configured to perform the bit allocation modification on the coding sub-band for count times again after the bit allocation is performed according to a value of the number of bit allocation modification iterations count and the importance of each coding sub-band at a coding side.

When the bit allocating module performs the bit allocation, the bit allocation step length and importance-reduction step length after the bit allocation of the low bit coding sub-band are less than the bit allocation step length and the importance-reduction step length after the bit allocation of the zero bit coding sub-band and high bit coding sub-band.

When the bit allocation modifying module performs bit modifying, the bit-modification step length and importance-reduction step length after the bit-modification of the low bit coding sub-band are less than the bit-modification step length and importance-reduction step length after the bit-modification of the zero bit coding sub-band and the high bit coding sub-band.

The frequency domain coefficient decoding unit is connected to the amplitude envelope decoding unit and the bit allocating unit and is configured to decode a low bit coding sub-band to obtain a quantization index of the low bit coding sub-band; and decode a high bit coding sub-band to obtain the index vector of the high bit coding sub-band, wherein, the low bit coding sub-band is a coding sub-band in which the number of bits allocated to one frequency domain coefficient is less than a preset threshold value, the high bit coding sub-band is a coding sub-band in which the number of bits allocated to one frequency domain coefficient is greater than or equal to a preset threshold value;

the frequency domain coefficient decoding unit, when performing decoding on the low bit coding sub-band, performs Huffman coding on the low bit coding sub-band according to the frequency domain coefficient Huffman coding flag at the coding side or directly decodes the low bit coding sub-band to obtain the vector quantization index of the low bit coding sub-band; when performing decoding on the high bit coding sub-band, directly decodes the high bit coding sub-band to obtain the vector quantization index of the high bit coding sub-band.

The frequency domain coefficient decoding unit, when performing Huffman decoding on the low bit coding sub-band, and when the number of bits allocated to one frequency domain coefficient of the coding sub-band is 1, if the value of the natural binary code of the quantization index is less than "1111 1111", calculates the quantization index according to the value of the natural binary code; if the value of the natural binary code of the quantization index is equal to "1111 1111", then continuously reads next bit in, wherein, if the next bit is 0, then the quantization index value is 127, if the next bit is 1, then the quantization index value is 128.

The classification lattice vector inverse quantizing unit is configured to perform inverse quantization of the pyramid lattice vector quantization on the quantization index of the low bit coding sub-band, and perform inverse quantization of the sphere lattice vector quantization on the index vector of the high bit coding sub-band.

The inverse normalization processing unit is configured to perform inverse normalization on values after the inverse quantization has been performed for the coding sub-band, and obtain the frequency domain coefficient.

Specifically, the inverse normalization is performed on $\overline{Y}_j^m$ to obtain the frequency domain coefficient of the $m^{th}$ vector of the coding sub-band j recovered in the decoding side:

$$\overline{X}_j^m = 2^{Th_q(j)/2} \cdot \overline{Y}_j^m$$

wherein, $Th_q(j)$ is an amplitude envelope quantization exponent of the $j^{th}$ coding sub-band.

The noise filling unit is configured to perform noise filling on the sub-band to which no bit is allocated in the frequency domain coefficient output value which is output by the inverse normalization processing unit;

the inverse modified discrete cosine transform (IMDCT) unit is connected to the noise filling unit and is configured to perform IMDCT on the frequency domain coefficient for which the noise filling has been performed to obtain an audio signal.

The classification lattice vector quantization inverse quantizing unit is described in detail with reference to FIG. 8.

Figure 8:
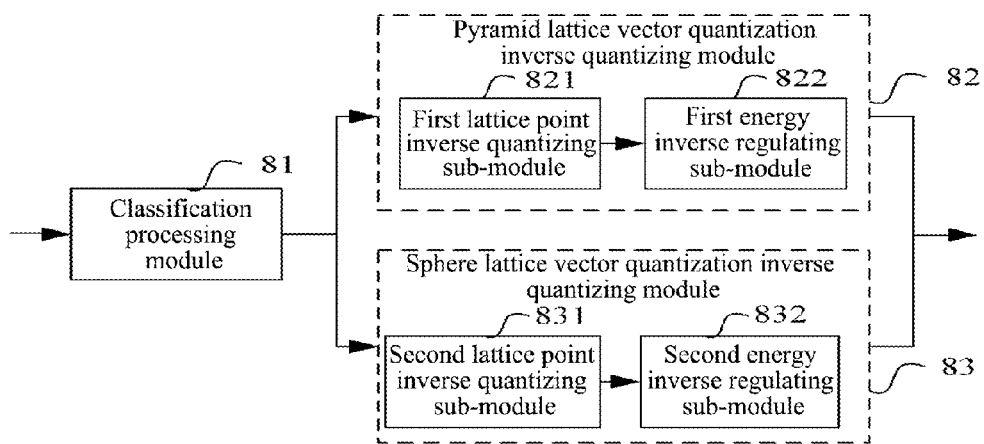
FIG. 8 is a schematic diagram of the structure of the modules of the classification lattice vector quantization inverse quantizing unit of the decoding system in accordance with the invention.

As shown in FIG. 8, the classification lattice vector quantization inverse quantizing unit comprises a classification processing module 81 and a pyramid lattice vector quantization inverse quantizing module 82 and a sphere lattice vector quantization inverse quantizing module 83, wherein, the classification processing module is configured to forward the quantization index of the low bit coding sub-band to the pyramid lattice vector quantization inverse quantizing module to process, and forward the quantization index of the high bit coding sub-band to the sphere lattice vector inverse quantizing module to process.

The pyramid lattice vector quantization inverse quantizing module is configured to perform inverse quantization on the quantization index of the low bit coding sub-band; wherein, the pyramid lattice vector inverse quantizing module 82 comprises a first lattice point inverse quantizing sub-module 821 and a first energy inverse regulating sub-module 822 which are connected, wherein, the first lattice point inverse quantizing sub-module is configured to determine an energy pyramid surface in which the quantization index of the low bit coding sub-band is located and its label on the energy pyramid surface and further more solve a corresponding $D_8$ lattice point;

the first energy inverse regulating sub-module is configured to perform energy inverse regulation on the solved $D_8$ lattice point, and obtain $$\overline{Y}_j^m = (Y+a)/\text{scale(index)}$$

wherein, $a=(2^{-6}, 2^{-6}, 2^{-6}, 2^{-6}, 2^{-6}, 2^{-6}, 2^{-6}, 2^{-6})$, scale(index) is a scaling factor;

The sphere lattice vector quantization inverse quantizing module is configured to perform inverse quantization on the index vector of the high bit coding sub-band; the sphere lattice vector quantization inverse quantizing module 83 comprises a second lattice point inverse quantizing sub-module 831 and a second energy inverse regulating sub-module 832 connected to each other, wherein, the second lattice point inverse quantizing sub-module is configured to solve the $D_8$ lattice point corresponding to the index vector, specifically comprising:

calculating x=k*G, and calculating ytenp=x/(2^(region_bit(j))); y=x-$f_{D8}$(ytenp)*(2^(*region_bit(j)*));

wherein, k is the index vector of the vector quantization, region_bit(j) represents the number of bits allocated to one frequency domain coefficient in the coding sub-band j; G is a generator matrix of the $D_8$ lattice point and its form is as follows:

$$G = \begin{bmatrix} 2 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 0 & 0 & 1 & 0 & 0 & 0 & 0 \\ 1 & 0 & 0 & 0 & 1 & 0 & 0 & 0 \\ 1 & 0 & 0 & 0 & 0 & 1 & 0 & 0 \\ 1 & 0 & 0 & 0 & 0 & 0 & 1 & 0 \\ 1 & 0 & 0 & 0 & 0 & 0 & 0 & 1 \end{bmatrix}$$

the second energy inverse regulating sub-module is configured to perform energy inverse regulation on the solved $D_8$ lattice point, and obtain $$\overline{Y}_j^m = y*\text{scale(region\_bit}(j))/(2^{region\_bit(j)})+a$$

wherein, $a=(2^{-6}, 2^{-6}, 2^{-6}, 2^{-6}, 2^{-6}, 2^{-6}, 2^{-6}, 2^{-6})$, scale(region_bit(j)) is the scaling factor;

The audio coding method and system of lattice vector quantization in the invention, which consider fully the allocation characteristic of the voice information source, perform quantization on the to-be-quantized vector in the merged lattice vector quantization, the pyramid lattice vector quantization and the sphere lattice vector quantization are respectively used for the low bit coding sub-band and the high bit coding sub-band specifically according to the number of bits allocated to the coding sub-band, and the inverse process of the coding is used in the decoding, thereby obtaining a good voice information source coding effect. In addition, a bit allocation with a variable step length is used for bit allocation, and the bit allocation step length of one frequency domain coefficient may be adjusted minimally to half an bit, thus improving the usage efficiency of bits. Meanwhile, the pyramid lattice vector quantizer with the low bit step length is designed, and the lattice point label algorithm has a low complexity, thus storage space is reduced. In addition, in the sphere lattice vector quantization of the high bit coding sub-band, a new criterion is used for the code-book-extension label, thus further reducing the complexity of the algorithm of the lattice vector quantizer. The algorithm for saving bits is also designed in the coding process.

Those skilled in the art may understand that all or part of the steps in the above method may be completed by instructing related hardware by the programs, and the programs may be stored in computer readable storage medium, such as read only memory, magnetic disk or optical disk and so on. Optionally, all or part of the steps of the above examples may also be implemented with one or more integrated circuits. Accordingly, all the modules/units in the above examples may be implemented in hardware or implemented in software functional modules. The invention is not limited to any combination of hardware and software.

INDUSTRIAL APPLICABILITY

The audio coding method and system of lattice vector quantization in the invention, which consider fully the allocation characteristic of the voice information source, perform quantization on the to-be-quantized vector in the merged lattice vector quantization, the pyramid lattice vector quantization and the sphere lattice vector quantization are respectively used for the low bit coding sub-band and the high bit coding sub-band specifically according to the number of bits allocated to the coding sub-band, and the inverse process of the coding is used in the decoding, thereby obtaining a good voice information source coding effect. In addition, a bit allocation with a variable step length is used for bit allocation, and the bit allocation step length of one frequency domain coefficient may be adjusted minimally to half an bit, thus improving the usage efficiency of bits. Meanwhile, the pyramid lattice vector quantizer with the low bit step length is designed, and the lattice point label algorithm has a low complexity, thus storage space is reduced. In addition, in the sphere lattice vector quantization of the high bit coding sub-band, a new criterion is used for the code-book-extension label, thus further reducing the complexity of the algorithm of the lattice vector quantizer.

What is claimed is:

1. An audio coding method of lattice vector quantization, comprising:
dividing frequency domain coefficients of an audio signal for which a modified discrete cosine transform (MDCT) has been performed into a plurality of coding sub-bands, and quantizing and coding an amplitude envelope value of each coding sub-band to obtain coded bits of the amplitude envelope;
performing bit allocation on each coding sub-band, and performing normalization, quantization and coding respectively on vectors in a low bit coding sub-band with pyramid lattice vector quantization and on vectors in a high bit coding sub-band with sphere lattice vector quantization to obtain coded bits of the frequency domain coefficients, wherein, the low bit coding sub-band is a coding sub-band in which a number of bits allocated to one frequency domain coefficient is less than a preset threshold value, the high bit coding sub-band is a coding sub-band in which a number of bits allocated to one frequency domain coefficient is greater than or equal to the preset threshold value; and
multiplexing and packing the coded bits of the amplitude envelope and the coded bits of the frequency domain coefficients of each coding sub-band to send to a decoding side.

2. The method according to claim 1, wherein,
before the step of performing bit allocation on each coding sub-band, the method further comprises: calculating an initial value of importance of each coding sub-band according to the amplitude envelope value of each coding sub-band;
in the step of performing bit allocation on each coding sub-band, the bit allocation is performed on each frequency domain coefficient in each coding sub-band according to the importance of each coding sub-band, wherein, during the bit allocation process, a bit allocation step length and an importance-reduction step length after the bit allocation are both variable.

3. The method according to claim 1, wherein,
the step of performing normalization and quantization on the low bit coding sub-band with pyramid lattice vector quantization comprises:
performing normalization processing on all the frequency domain coefficients in the coding sub-band by using the quantized amplitude envelope value of the coding sub-band to group to form a plurality of multidimensional to-be-quantized vectors; performing quantization processing on each to-be-quantized vector; wherein, the step of performing quantization processing on each to-be-quantized vector comprises: performing an energy regulation on a 8-dimension to-be-quantized vector in the coding sub-band, and quantizing the energy-regulated 8-dimension to-be-quantized vector to a $D_8$ lattice point; and
comparing an energy of the $D_8$ lattice point obtained by the quantization with a maximum pyramid surface energy radius in a coding code book, if the energy of the $D_8$ lattice point is less than or equal to the maximum pyramid surface energy radius, calculating a quantization index of the $D_8$ lattice point in the code book; if the energy of the $D_8$ lattice point is greater than the maximum pyramid surface energy radius, performing an energy truncation on the regulated to-be-quantized vector of the coding sub-band till the energy of a quantization lattice point of the energy-trunked to-be-quantized vector is not greater than the maximum pyramid surface energy radius, and meanwhile continuously adding an energy for the energy-trunked to-be-quantized vector till the energy of the $D_8$ lattice point to which the energy-added to-be-quantized vector is quantized is more than the maximum pyramid surface energy radius, and then determining a last $D_8$ lattice point whose energy is not more than the maximum pyramid surface energy radius to be a vector quantization lattice point, and calculating the quantization index of the vector quantization lattice point in the code book;
and/or
the step of performing normalization and quantization on the high bit coding sub-band with sphere lattice vector quantization comprises:
performing normalization processing on all the frequency domain coefficients in the coding sub-band by using the quantized amplitude envelope value of the coding sub-band to group to form a plurality of multidimensional to-be-quantized vectors; performing quantization processing on each to-be-quantized vector; wherein, the step of performing quantization processing on each to-be-quantized vector comprises:
performing an energy regulation on a 8-dimension to-be-quantized vector in the coding sub-band, and quantizing the energy regulated 8-dimension to-be-quantized vector to a $D_8$ lattice point;
dividing the $D_8$ lattice point value obtained through the quantization by 2 to a power of a number of allocated bits $2^{region\_bit(j)}$, and then re-quantizing to the $D_8$ lattice point, judging whether the re-quantized $D_8$ lattice point value is a zero vector, if yes, determining that a zero vector condition is met, if not, determining that the zero vector condition is not met, wherein, region_bit(j) represents the number of bits allocated to one frequency domain coefficient in a $j^{th}$ coding sub-band;
if the zero vector condition is met, calculating an index vector of the $D_8$ lattice point; and
if the zero vector condition is not met, performing energy truncation on a value of a to-be-quantized vector till the zero vector condition is met, backing up multiple value w of the to-be-quantized vector itself, adding the backup multiple value w to the energy-trunked to-be-quantized vector, then re-quantizing to the $D_8$ lattice point, judging whether the zero vector condition is met, if not, calculating a latest index vector k of the $D_8$ lattice point meeting the zero vector condition, if yes, adding continuously the backup multiple value w to the to-be-quantized vector and then re-quantizing to the $D_8$ lattice point till the zero vector condition is not met.

4. The method according to claim 3, wherein,
in the step of performing the energy regulation on the 8-dimension to-be-quantized vector, firstly, according to the number of bits region_bit(j) allocated to one frequency domain coefficient in the coding sub-band j where the 8-dimension to-be-quantized vector is located, looking a below table for a code book sequence number index and a energy scaling factor scale corresponding to the number of bits; then performing the energy regulation on the to-be-quantized vector according to a following equation:

$$\tilde{Y}_{j,scale}{}^m e = (Y_j{}^m - a) * scale(index)$$

wherein, $Y_j{}^m$ represents a $m^{th}$ normalized 8-dimension to-be-quantized vector in the coding sub-band j, $\tilde{Y}_{j,scale}{}^m$ represents a 8-dimension vector after the energy regulation has been performed on $Y_j{}^m$, $a=(2^{-6},2^{-6},2^{-6},2^{-6},2^{-6},2^{-6},2^{-6},2^{-6})$;

| Number of bits Region_bit | Code book sequence number Index | Energy scaling factor Scale | Maximum pyramid surface energy radius LargeK |
|---|---|---|---|
| 1 | 0 | 0.5 | 2 |
| 1.5 | 1 | 0.65 | 4 |
| 2 | 2 | 0.85 | 6 |
| 2.5 | 3 | 1.2 | 10 |
| 3 | 4 | 1.6 | 14 |
| 3.5 | 5 | 2.25 | 22 |
| 4 | 6 | 3.05 | 30 |
| 4.5 | 7 | 4.64 | 44 | in the step of quantizing the energy-regulated 8-dimension to-be-quantized vector to the $D_8$ lattice point, quantizing the energy-regulated 8-dimension vector $\tilde{Y}_{j,scale}{}^m$ to the $D_8$ lattice point $\hat{Y}_j{}^m$ with a following equation:

$$\hat{Y}_j{}^m = f_{D_8}(\tilde{Y}_{j,scale}{}^m)$$

wherein, $f_{D_8}(\cdot)$ represents a quantizing operator for mapping a certain 8-dimension vector to a $D_8$ lattice point;
the step of calculating the quantization index of the $D_8$ lattice point $\hat{Y}_j{}^m$ in the code book comprises:
step 1. labeling the lattice points on each pyramid surface according to an amplitude of the pyramid surface energy;
wherein, for an integer lattice point grid $Z^L$ with the dimension being L, the pyramid surface with an energy radius being K is defined as:

$$S(L, K) = \left\{ Y = (y_1, y_2, \ldots, y_L) \in Z^L \mid \sum_{i=1}^{L} |y_i| = K \right\}$$

wherein, N(L, K) is noted as a number of lattice points in S(L, K), and for the integer grid $Z^L$, following recursion formulas are for N(L, K):

$N(L,0)=1(L\geq 0), N(0,K)=0(K\geq 1)$ $N(L,K)=N(L-1,K)+N(L-1,K-1)+N(L,K-1)(L\geq 1,K\geq 1);$ for an integer lattice point $Y=(y_1, y_2, \ldots, y_L) \in Z^L$ on the pyramid surface with the energy radius being K, a number b in $[0, 1, \ldots, N(L,K)-1]$ is used to identify, and b is referred to as a label of the lattice point, and steps for solving the label b are as follows:
step 1.1, letting b=0, i=1, k=K, l=L, calculating N(m,n), (m<=L, n<=K) according to the recursion formulas, and defining:

$$\text{sgn}(x) = \begin{cases} 1 & x > 0 \\ 0 & x = 0 \\ -1 & x < 0 \end{cases};$$

step 1.2, if $y_i=0$, then b=b+0;
if $|y_i|=1$, then $$b = b + N(l-1, k) + \left[\frac{1-\text{sgn}(y_i)}{2}\right] N(l-1, k-1);$$

if $|y_i|>1$, then $$b = b + N(l-1, k) + 2\sum_{j=1}^{|y_i|-1} N(l-1, k-j) + \left[\frac{1-\text{sgn}(y_i)}{2}\right] N(l-1, k-|y_i|);$$

step 1.3, $k=k-|y_i|$, $l=l-1$, $i=i+1$, if k=0 now, stopping searching, b(j, m)=b, which is the label of Y, or else, continuing step 1.2;
step 2. labeling uniformly the lattice point on all the pyramid surfaces;
wherein, the uniform label of the lattice point on all the pyramid surfaces is calculated according to the number of the lattice points on each pyramid surface and the label of the lattice point on the pyramid surface where the lattice point is located, $$\text{index\_b}(j, m) = b(j, m) + \sum_{kk=0}^{K-2} N(8, kk)$$

wherein, kk is an even number, b(j,m) is the label of $D_8$ lattice point $\hat{Y}_j{}^m$ on the pyramid surface where the $D_8$ lattice point $\hat{Y}_j{}^m$ is located, and index_b(j,m) is the quantization index of the $D_8$ lattice point $\hat{Y}_j{}^m$ in the code book.

5. The method according to claim 1, wherein,
the step of coding the low bit coding sub-band with pyramid lattice vector quantization comprises:
performing Huffman coding on the quantization indexes of all the low bit coding sub-bands; and
if a total number of consumed bits of the Huffman coded quantization indexes of all the low bit coding sub-bands is less than a total number of bits needed for natural coding of the quantization indexes of all the low bit coding sub-bands, then using the Huffman coding and setting a frequency domain coefficient Huffman encoding flag to be 1 or true, using bits saved by the Huffman coding to modify the number of the allocated bits of the coding sub-band and perform vector quantization and coding again on the coding sub-band for which the number of the allocated bits is modified; if the total number of consumed bits of the Huffman coded quantization indexes of all the low bit coding sub-bands is greater than or equal to the total number of bits needed for natural coding of the quantization indexes of all the low bit coding sub-bands, performing the natural coding on the quantization index again, and setting the frequency domain coefficient Huffman encoding flag to be 0 or false.

6. The method according to claim 5, wherein,
the step of using bits saved by the Huffman coding to modify the number of the allocated bits of the coding sub-band comprises:
calculating the number of bits saved by the Huffman coding;
finding a coding sub-band with maximum importance in all the coding sub-bands, if the number of bits allocated to the coding sub-band has reached a maximum value of the number of bits which can be allocated to the coding sub-band, adjusting the importance of the coding sub-band to be lowest, and not modifying the number of allocated bits for the coding sub-band any more, if the number of bits allocated to the coding sub-band has not reached the maximum value of the number of bits which can be allocated to the coding sub-band, then performing bit allocation modification on the coding sub-band with the maximum importance; and
after each time the number of allocated bits is modified, i.e. a number of bit allocation modification iterations count is added by 1, if the number of the bit allocation modification iterations count has reached a preset upper limit or the number of bits that can be used is less than the number of bits that is needed for the bit allocation modification, ending a process of the bit allocation modification.

7. The method according to claim 5, wherein,
when the Huffman coding is performed on the quantization indexes of all the low bit coding sub-bands,
in all the coding sub-bands in which the number of bits allocated to one frequency domain coefficient is greater than 1, less than 5 and not 2, each four-bits in natural binary code for each vector quantization index are divided into one group and the Huffman coding is performed on that group, and a sum of the numbers of bits of the Huffman coding for all the 4-bits groups is the number of bits consumed in the Huffman coding of the quantization index;
in all the coding sub-bands in which the number of bits allocated to one frequency domain coefficient is 2, 15 bits are used for coding the pyramid lattice vector quantization index of each 8-dimension vector, and the 15 bits are divided into 3 4-bits groups and 1 3-bits group, then the Huffman coding is performed on the groups, a sum of the numbers of consumed bits of the 4 groups of Huffman coding is the number of bits consumed in the Huffman coding of the quantization index;
when the number of bits allocated to one frequency domain coefficient of the coding sub-band is 1, if the quantization index is less than 127, then the quantization index is coded with 7 bits, which are divided into 1 3-bits group and 1 4-bits group, the Huffman coding is performed respectively on the two groups, a sum of the numbers of bits of the two groups consumed in the Huffman coding is the number of bits consumed in the Huffman coding of the quantization index;
when the number of bits allocated to one frequency domain coefficient of the coding sub-band is 1, if the quantization index is equal to 127, then the natural binary code of the quantization index is defined as "1111 1110", 7 1s in front are divided into 1 3-bits group and 1 4-bits group, the Huffman coding is performed respectively on the two groups, a sum of the numbers of bits of the two groups consumed in the Huffman coding is the number of bits consumed in the Huffman coding of the quantization index;
when the number of bits allocated to one frequency domain coefficient of the coding sub-band is 1, if the quantization index is equal to 128, then the natural binary code of the quantization index is defined as "1111 1111", 7 1s in front are divided into 1 3-bits group and 1 4-bits group, the Huffman coding is performed respectively on the two groups, a sum of the numbers of bits of the two groups consumed in the Huffman coding is the number of bits consumed in the Huffman coding of the quantization index.

8. An audio decoding method of lattice vector quantization, comprising:
decoding coded bits of each amplitude envelope in a to-be-decoded bit steam to obtain an amplitude envelope quantization exponent of each coding sub-band;
performing bit allocation on each coding sub-band, and performing decoding, inverse quantization and inverse normalization of pyramid lattice vector quantization on a low bit coding sub-band to obtain frequency domain coefficients of the low bit coding sub-band, and performing decoding, inverse quantization and inverse normalization of sphere lattice vector quantization on a high bit coding sub-band to obtain frequency domain coefficients of the high bit coding sub-band; wherein, the low bit coding sub-band is a coding sub-band in which a number of bits allocated to one frequency domain coefficient is less than a preset threshold value, the high bit coding sub-band is a coding sub-band in which a number of bits allocated to one frequency domain coefficient is greater than or equal to the preset threshold value; and
performing an inverse modified discrete cosine transform (IMDCT) on the frequency domain coefficients for which noise filling has been performed to obtain a final audio signal.

9. The method according to claim 8, wherein,
before the step of performing bit allocation on each coding sub-band, the method further comprises: calculating an initial value of importance of each coding sub-band according to the amplitude envelope value of each coding sub-band;
in the step of performing bit allocation on each coding sub-band, the bit allocation is performed on each frequency domain coefficient in each coding sub-band according to the importance of each coding sub-band, wherein, during the bit allocation, a bit allocation step length and an importance-reduction step length after the bit allocation are both variable;
after the bit allocation is performed and before the decoding, according to a value of a number of bit allocation modification iterations count and the importance of each coding sub-band at a coding side, the bit allocation modification is performed on the coding sub-band for count times again.

10. The method according to claim 8, wherein,
in the step of performing decoding, inverse quantization and inverse normalization of pyramid lattice vector quantization on the low bit coding sub-band, vector quantization indexes of the low bit coding sub-band are obtained by performing Huffman coding or direct decoding on the low bit coding sub-band according to a frequency domain coefficient Huffman encoding flag of the coding side, and the inverse quantization and inverse normalization of pyramid lattice vector quantization are performed on all the vector quantization indexes to obtain the frequency domain coefficients of the low bit coding sub-band; in the step of performing decoding, inverse quantization and inverse normalization of sphere lattice vector quantization on the high bit coding sub-band, natural decoding is directly used to obtain vector quantization indexes of the high bit coding sub-band, and the inverse quantization and inverse normalization of the sphere lattice vector quantization are performed on all the vector quantization indexes to obtain the frequency domain coefficients of the high bit coding sub-band.

11. The method according to claim 8, wherein, in a process of decoding the low bit coding sub-band, when the number of bits allocated to one frequency domain coefficient of the coding sub-band is 1, if a value of natural binary code of the quantization index is less than "1111 111", then the quantization index is calculated according to the value of the natural binary code; if the value of the natural binary code of the quantization index is equal to "1111 111", then a next bit is continuously read in, if the next bit is 0, then the value of the quantization index is 127, if the next bit is 1, then the value of the quantization index is 128.

12. The method according to claim 8, wherein, in the step of decoding the low bit coding sub-band, if the frequency domain coefficient Huffman encoding flag indicates that the Huffman coding is not used, then a $m^{th}$ vector quantization index index_b(j,m) in a low bit coding sub-band j is directly decoded; if the frequency domain coefficient Huffman encoding flag indicates that the Huffman coding is used, then the $m^{th}$ vector quantization index index_b(j,m) in the low bit coding sub-band j is obtained by Huffman decoding;

the step of performing inverse quantization of pyramid lattice vector quantization on the low bit coding sub-band comprises:

a. determining an energy pyramid surface in which the quantization index is located and a label of the quantization index on that energy pyramid surface;

wherein, kk is searched for in pyramid surface energies from 2 to LargeK(region_bit(j)) to satisfy a following inequality:

$N(8,kk) <= \text{index}\_b(j,m) < N(8,kk+2)$, if such a kk is found, then K=kk is the energy of the pyramid surface where a $D_8$ lattice point corresponding to the quantization index_index b(j,m) is located, b=index_b(j,m)−N(8,kk) is an index label of the $D_8$ lattice point on the pyramid surface where the $D_8$ lattice point is located;

if such a kk is not found, the pyramid surface energy of the $D_8$ lattice point corresponding to the quantization index index_b(j,m) K=0 and the index label b=0;

b. steps for solving a D8 lattice point vector Y=(y1, y2 y3, y4, y5, y6, y7, y8,) whose pyramid surface energy is K and the index label is b are as follows:

step 1. letting Y=(0,0,0,0,0,0,0,0), xb=0, i=1, k=K, l=8;
step 2. if b=xb, then yi=0; jumping to step 6;
step 3. if b<xb+N(l−1,k), then yi=0, jumping to step 5; or else, xb=xb+N(l−1,k); letting j=1;
step 4. if b<xb+2*N(l−1,k−j), then
 if xb<=b<xb+N(l−1,k−j), then yi=j;
 if b>=xb+N(l−1,k−j), then yi=−j, xb=xb+N(l−1, k−j);
 or else, xb=xb+2*N(l−1, k−j), j=j+1; continuing to perform the current step;
step 5. updating k=k−|yi|, l=l−1, i=i+1, if k>0, jumping to step 2;
step 6. if k>0, then y8=k−|yi|, Y=(y1, y2, . . . , y8), which is the solved lattice point;

c. performing an energy inverse regulation on the solved D8 lattice point, and obtaining $\overline{Y}_j^m = (Y+a)/\text{scale(index)}$ wherein, $a=(2^{-6}, 2^{-6}, 2^{-6}, 2^{-6}, 2^{-6}, 2^{-6}, 2^{-6}, 2^{-6})$, scale(index) is a scaling factor and is found from a first corresponding table,

| the first corresponding table | | | |
|---|---|---|---|
| Number of bits Region_bit | Code book sequence number Index | Energy scaling factor Scale | Maximum pyramid surface energy radius LargeK |
| 1 | 0 | 0.5 | 2 |
| 1.5 | 1 | 0.65 | 4 |
| 2 | 2 | 0.85 | 6 |
| 2.5 | 3 | 1.2 | 10 |
| 3 | 4 | 1.6 | 14 |
| 3.5 | 5 | 2.25 | 22 |
| 4 | 6 | 3.05 | 30 |
| 4.5 | 7 | 4.64 | 44 | in the step of performing inverse normalization on all the $\overline{Y}_j^m$ to obtain the frequency domain coefficients of the low bit coding sub-band, an inverse normalization processing is performed on $\overline{Y}_j^m$ to obtain the frequency domain coefficient of the $m^{th}$ vector of the coding sub-band j recovered at a decoding side:

$\overline{X}_j^m = 2^{Th_q(j)/2} \cdot \overline{Y}_j^m$ wherein, $Th_q(j)$ is an amplitude envelope quantization exponent of the $j^{th}$ coding sub-band.

13. The method according to claim 8, wherein, the step of directly using the natural coding to obtain the vector quantization indexes of the high bit coding sub-band and performing inverse quantization of the sphere lattice vector quantization on all the vector quantization indexes comprises:

a). calculating x=k*G, and calculating ytemp=x/(2^(region_bit(j))); wherein, k is the index vector of the $m^{th}$ vector quantization in the high bit coding sub-band j, region_bit(j) represents the number of bits allocated to one frequency domain coefficient in the coding sub-band j; G is a generator matrix of the $D_8$ lattice point and a form of the generator matrix is as follows:

$$G = \begin{bmatrix} 2 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 0 & 0 & 1 & 0 & 0 & 0 & 0 \\ 1 & 0 & 0 & 0 & 1 & 0 & 0 & 0 \\ 1 & 0 & 0 & 0 & 0 & 1 & 0 & 0 \\ 1 & 0 & 0 & 0 & 0 & 0 & 1 & 0 \\ 1 & 0 & 0 & 0 & 0 & 0 & 0 & 1 \end{bmatrix}$$

b). calculating y=x−f$_{D8}$(ytemp)*(2^(region_bit(j)));

c). performing an energy inverse regulation on the solved D$_8$ lattice point and obtaining $$\overline{Y}_j^m = y * \text{scale}(\text{region\_bit}(j))/(2^{\text{region\_bit}(j)}) + a$$

wherein, a=(2$^{-6}$,2$^{-6}$,2$^{-6}$,2$^{-6}$,2$^{-6}$,2$^{-6}$,2$^{-6}$,2$^{-6}$), scale(region_bit(j)) is a scaling factor and is found from a second corresponding table,

| the second corresponding table | |
| --- | --- |
| Number of allocated bits region_bit | Energy scaling factor scale |
| 5 | 6 |
| 6 | 6.2 |
| 7 | 6.5 |
| 8 | 6.2 |
| 9 | 6.6 | in the step of performing inverse normalization on all the $\overline{Y}_j^m$ s to obtain the frequency domain coefficients of the high bit coding sub-band, performing inverse normalization processing on $\overline{Y}_j^m$ to obtain the frequency domain coefficient of the m$^{th}$ vector of the coding sub-band j recovered at the decoding side:

$$\overline{X}_j^m = 2^{Th_q(j)/2} \cdot \overline{Y}_j^m$$

wherein, Th$_q$(j) is an amplitude envelope quantization exponent of the j$^{th}$ coding sub-band.

14. An audio coding system of lattice vector quantization, comprising: a modified discrete cosine transform (MDCT) unit, an amplitude envelope calculating unit, an amplitude envelope quantizing and coding unit, a bit allocating unit, a normalization processing unit, a classification lattice vector quantizing and coding unit and a bit stream multiplexer; wherein, the MDCT unit is configured to perform the MDCT on an audio signal to generate frequency domain coefficients;

the amplitude envelope calculating unit is connected to the MDCT unit and configured to divide the frequency domain coefficients generated by the MDCT unit into a plurality of coding sub-bands, and calculate an amplitude envelope value of each coding sub-band;

the amplitude envelope quantizing and coding unit is connected to the amplitude envelope calculating unit and configured to quantize and code the amplitude envelope value of each coding sub-band to generate coded bits of the amplitude envelope of each coding sub-band;

the bit allocating unit is connected to the amplitude envelope quantizing and coding unit and configured to perform bit allocation to obtain a number of coded bits allocated to each frequency domain coefficient in each coding sub-band;

the normalization processing unit is connected to the MDCT unit and configured to use a quantization amplitude envelope value of the coding sub-band to perform normalization processing on all the frequency domain coefficients in each coding sub-band;

the classification lattice vector quantizing and coding unit is connected to the normalization processing unit and the bit allocating unit and configured to perform quantization and coding on normalized to-be-quantized vectors in a low bit coding sub-band and a high bit coding sub-band with pyramid lattice vector quantization and sphere lattice vector quantization respectively to obtain the coded bits of the frequency domain coefficients;

wherein, the low bit coding sub-band is a coding sub-band in which the number of bits allocated to one frequency domain coefficient is less than a preset threshold value, the high bit coding sub-band is a coding sub-band in which the number of bits allocated to one frequency domain coefficient is greater than or equal to the preset threshold value;

the bit stream multiplexer is connected to the amplitude envelope quantizing and coding unit and the classification lattice vector quantizing and coding unit and configured to multiplex the coded bits of each coding sub-band and the coded bits of the frequency domain coefficients to send to a decoding side.

15. The system according to claim 14, wherein, the bit allocating unit comprises an importance calculating module and a bit allocating module which are connected, wherein, the importance calculating module is configured to calculate an initial value of importance of each coding sub-band according to the amplitude envelope value of the coding sub-band;

the bit allocating module is configured to perform bit allocation on each frequency domain coefficient in each coding sub-band according to the importance of each coding sub-band, wherein, during the bit allocation, a bit allocation step length and an importance-reduction step length after the bit allocation are both variable.

16. The system according to claim 14, wherein, the classification lattice vector quantizing and coding unit comprises a classification processing module and a pyramid lattice vector quantizing module, wherein, the classification processing module is connected to the normalization processing unit and configured to group the normalized frequency domain coefficients to form multidimensional to-be-quantized vectors, and forward the normalized to-be-quantized vectors of the low bit coding sub-band to the pyramid lattice vector quantizing module;

the pyramid lattice vector quantizing module is connected to the classification processing module and configured to perform the pyramid lattice vector quantization on the normalized to-be-quantized vector of each low bit coding sub-band; the pyramid lattice vector quantizing module comprises a first energy regulating sub-module, a first lattice point quantizing sub-module, a first energy adjusting sub-module and quantization index calculating sub-module, wherein, the first energy regulating sub-module is configured to perform an energy regulation on an 8-dimension to-be-quantized vector in the coding sub-band;

the first lattice point quantizing sub-module is connected to the first energy regulating sub-module and configured to quantize the 8-dimension to-be-quantized vector to a D$_8$ lattice point;

the first energy adjusting sub-module is connected to the first lattice point quantizing sub-module and configured to compare an energy of the D$_8$ lattice point with a maximum pyramid surface energy radius in a coding code book, if the energy of the D$_8$ lattice point is less than or equal to the maximum pyramid surface energy radius, notify the quantization index calculating sub-module to calculate a quantization index of the D$_8$ lattice point in the code book; if the energy of the D$_8$ lattice point is greater than the maximum pyramid surface energy radius, perform an energy truncation on the regulated to-be-quantized vector in the coding sub-band, and notify the first lattice point quantizing sub-module to truncate the energy till the energy of the quantization lattice point of the energy-trunked to-be-quantized vector is not greater than the maximum pyramid surface energy radius, and meanwhile continuously add an energy to the energy-trunked to-be-quantized vector, and notify the first lattice point quantizing sub-module to quantize the energy-added to-be-quantized vector to the $D_8$ lattice point till the energy of the $D_8$ lattice point to which the energy-added to-be-quantized vector is more than the maximum pyramid surface energy radius, and notify the quantization index calculating sub-module to calculate the quantization index of a last $D_8$ lattice point whose energy is not more than the maximum pyramid surface energy radius in the code book;

the index quantization calculating module is connected to the first energy adjusting sub-module and configured to calculate the quantization index of the $D_8$ lattice point in the code book according to a notification of the first energy adjusting sub-module;

and the classification lattice vector quantizing and coding unit further comprises a sphere lattice vector quantizing module connected to the classification processing module; the classification processing module is further configured to forward the normalized to-be-quantized vector in the high bit coding sub-band to the sphere lattice vector quantizing module to process;

the sphere lattice vector quantizing module is configured to perform sphere lattice vector quantization on the normalized to-be-quantized vector in the high bit coding sub-band; the sphere lattice vector quantizing module comprises a second energy regulating sub-module, a second lattice point quantizing sub-module, a zero vector condition judging sub-module, a second energy adjusting sub-module and an index vector calculating sub-module, wherein, the second energy regulating sub-module is configured to perform the energy regulation on the 8-dimension to-be-quantized vector in the coding sub-band;

the second lattice point quantizing sub-module is connected to the second energy regulating sub-module and configured to quantize the 8-dimension to-be-quantized vector to a $D_8$ lattice point;

the zero vector condition judging sub-module is connected to the second lattice point quantizing sub-module and configured to judge whether the $D_8$ lattice point meets a zero vector condition, if yes, notify the index vector calculating sub-module to calculate the index vector of the $D_8$ lattice point; if not, notify the second energy adjusting sub-module to adjust the energy of the to-be-quantized vector; the zero vector condition is to divide the $D_8$ lattice point value obtained by vector quantization by 2 to a power of the number of allocated bits $2^{region\_bit(j)}$, and then project to the $D_8$ lattice point, the projected $D_8$ lattice point value is a zero vector, wherein, region_bit(j) represents the number of bits allocated to one frequency domain coefficient in the $j^{th}$ coding sub-band;

the second energy adjusting sub-module is connected to the zero vector condition judging sub-module and the second lattice point quantizing sub-module and configured to perform an energy truncation on a value of the to-be-quantized vector, and notify the second lattice point quantizing sub-module to quantize the energy-trunked to-be-quantized vector to a $D_8$ lattice point till the zero vector condition is satisfied; back up a multiple value w of the to-be-quantized vector itself, and add the backup multiple value w to the energy-trunked to-be-quantized vector, and notify the second lattice point quantizing sub-module to quantize the energy-trunked to-be-quantized vector to the $D_8$ lattice point till the zero vector condition is not satisfied; and notify the index vector calculating sub-module to calculate a latest index vector of the $D_8$ lattice point meeting the zero vector condition;

the index vector calculating sub-module is connected to the zero vector condition judging sub-module and the second energy adjusting sub-module and configured to calculate the quantization index of the $D_8$ lattice point in the code book according to notifications from the zero vector condition judging sub-module and the second energy adjusting sub-module.

17. The system according to claim 16, wherein, the first energy regulating sub-module is configured to, in the step of performing the energy regulation on the 8-dimension to-be-quantized vector, according to a number of bits region_bit(j) allocated to one frequency domain coefficient in the coding sub-band j where the 8-dimension to-be-quantized vector is located, search a below table for a code book sequence number index and a energy scaling factor scale corresponding to the number of bits region_bit(j); then perform the energy regulation on the to-be-quantized vector according to a following equation:

$$\tilde{Y}_{j,scale}^m = (Y_j^m - a) * scale(index)$$

wherein, $Y_j^m$ represents a $m^{th}$ normalized 8-dimension to-be-quantized vector in the coding sub-band j, $\tilde{Y}_{j,scale}^m$ represents a 8-dimension vector after performing the energy regulation on $Y_j^m$, $a=(2^{-6}, 2^{-6}, 2^{-6}, 2^{-6}, 2^{-6}, 2^{-6}, 2^{-6}, 2^{-6})$;

| Number of bits Region_bit | Code book sequence number Index | Energy scaling factor Scale | Maximum pyramid surface energy radius LargeK |
|---|---|---|---|
| 1 | 0 | 0.5 | 2 |
| 1.5 | 1 | 0.65 | 4 |
| 2 | 2 | 0.85 | 6 |
| 2.5 | 3 | 1.2 | 10 |
| 3 | 4 | 1.6 | 14 |
| 3.5 | 5 | 2.25 | 22 |
| 4 | 6 | 3.05 | 30 |
| 4.5 | 7 | 4.64 | 44 | the first lattice point quantizing sub-module is configured to, when the 8-dimension to-be-quantized vector is quantized to a $D_8$ lattice point, quantize the 8-dimension vector $\tilde{Y}_{j,scale}^m$ to the $D_8$ lattice point $\tilde{Y}_j^m$ with a following equation:

$$\tilde{Y}_j^m = f_{D_8}(\tilde{Y}_{j,scale}^m)$$

wherein, $f_{D_8}(\cdot)$ represents a quantizing operator for mapping a certain 8-dimension vector to a $D_8$ lattice point;

the quantization index calculating sub-module is configured to, when calculating the quantization index of the $D_8$ lattice point $\tilde{Y}_j^m$ in the code book, label the lattice points on each pyramid surface respectively according to an amplitude of the pyramid surface energy, then label uniformly the lattice point on all the pyramid surfaces, wherein, the uniform label is the quantization index of the $D_8$ lattice point $\tilde{Y}_j^m$ in the code book.

18. The system according to claim 14, wherein, the classification lattice vector quantizing and coding unit further comprises a coding type judging module, a Huffman coding module, a natural coding module and a bit allocation modifying module, wherein, the coding type judging module is configured to judge whether a total number of consumed bits of Huffman coded quantization indexes of all the low bit coding sub-bands is less than a total number of bits needed for natural coding of the quantization indexes of all the low bit coding sub-bands, if yes, notify the Huffman coding module and bit allocation modifying module; if the total number of consumed bits of Huffman coded quantization indexes of all the low bit coding sub-bands is greater than or equal to the total number of bits needed for natural coding of the quantization indexes of all the low bit coding sub-bands, notify the natural coding module;

the Huffman coding module is configured to perform the Huffman coding on the quantization index of the low bit coding sub-band, and set a frequency domain coefficient Huffman encoding flag to be 1 or true, the natural coding module is configured to perform the natural coding on the quantization index of the low bit coding sub-band and the index vector of the high bit coding sub-band;

the bit allocation modifying module is configured to use bits saved by the Huffman coding to modify the number of allocated bits of the coding sub-band, and notify the classification processing module to classify the coding sub-bands with the number of allocated bits being modified, then to perform vector quantization and coding again.

19. The system according to claim 18, wherein, the bit allocation modifying module is configured to, when performing bit allocation, search for a coding sub-band with a maximum importance in all the coding sub-bands, if the number of bits allocated to the coding sub-band has reached a maximum value of the number of bits which can be allocated to the coding sub-band, adjust the importance of the coding sub-band to be lowest, and not modify the number of allocated bits for the coding sub-band any more, if the number of bits allocated to the coding sub-band has not reached the maximum value of the number of bits which can be allocated to the coding sub-band, then perform bit allocation modification on the coding sub-band with the maximum importance;

during the bit allocation modification, allocate 1 bit to the coding sub-band with the number of allocated bits being 0, and reduce the importance by 1 after the bit allocation; allocate 0.5 bit to the coding sub-band with the number of allocated bits being greater than 0 and less than 5, and reduce the importance by 0.5 after the bit allocation; allocate 1 bit to the coding sub-band with the number of allocated bits being greater than 5, and reduce the importance by 1 after the bit allocation; and after each time the number of allocated bits is modified by the bit allocation modifying module, i.e. a number of bit allocation modification iterations count is added by 1, if the number of bit allocation modification iterations count has reached a preset upper limit or the number of bits which can be used is less than the number of bits needed for the bit allocation modification, end a process of the bit allocation modification.

20. The system according to claim 18, wherein, when the Huffman coding module performs the Huffman coding on the quantization indexes of all the low bit coding sub-bands, in all the coding sub-bands in which the number of bits allocated to one frequency domain coefficient is greater than 1, less than 5 and not 2, the Huffman coding module divides each 4-bits in natural binary code of each vector quantization index into one group and performs the Huffman coding thereon, wherein, a sum of the numbers of bits of the Huffman coding of all the 4-bits groups is the number of bits consumed in the Huffman coding of the quantization index;

in all the coding sub-bands in which the number of bits allocated to one frequency domain coefficient is 2, the Huffman coding module uses 15 bits for coding the pyramid lattice vector quantization index of each 8-dimension vector, and divides the 15 bits into 3 4-bits groups and 1 3-bits group, then performs the Huffman coding on the groups respectively, wherein, a sum of the numbers of consumed bits of Huffman coding of the 4 groups is the number of bits consumed in the Huffman coding of the quantization index;

when the number of bits allocated to one frequency domain coefficient of the coding sub-band is 1, if the quantization index is less than 127, then the Huffman coding module uses 7 bits for coding the quantization index, and divides the 7 bits into 1 3-bits group and 1 4-bits group, performs the Huffman coding respectively on that two groups, wherein, a sum of the numbers of consumed bits of the Huffman coding of the two groups is the number of bits consumed in the Huffman coding of the quantization index;

when the number of bits allocated to one frequency domain coefficient of the coding sub-band is 1, if the quantization index is equal to 127, then the Huffman coding module defines the natural binary code thereof as "1111 1110", divides 7 1s in front into 1 3-bits group and 1 4-bits group, performs the Huffman coding respectively on that two groups, wherein, a sum of the numbers of consumed bits of Huffman coding of the two groups is the number of bits consumed in the Huffman coding of the quantization index;

when the number of bits allocated to one frequency domain coefficient of the coding sub-band is 1, if the quantization index is equal to 128, then the Huffman coding module defines the natural binary code thereof as "1111 1111", divides 7 1s in front into 1 3-bits group and 1 4-bits group, performs the Huffman coding respectively on that two groups, wherein, a sum of the numbers of consumed bits of Huffman coding of the two groups is the number of bits consumed in the Huffman coding of the quantization index.

21. An audio decoding system of lattice vector quantization, comprising: a bit stream demultiplexer, a coding sub-band amplitude envelope decoding unit, a bit allocating unit, a frequency domain coefficient decoding unit, a classification lattice vector quantization inverse quantizing unit, an inverse normalization processing unit, a noise filling unit and an inverse modified discrete cosine transform (IMDCT) unit, wherein, the bit stream demultiplexer is configured to separate coded bits of an amplitude envelope from a to-be-decoded bit stream;

the coding sub-band amplitude envelope decoding unit is connected to the bit stream demultiplexer and configured to decode the coded bits of the amplitude envelope output by the bit stream demultiplexer to obtain an amplitude envelope quantization exponent of each coding sub-band;

the bit allocating unit is connected to the amplitude envelope decoding unit and configured to perform bit allocation to obtain a number of coded bits allocated to each frequency domain coefficient in each coding sub-band;

the frequency domain coefficient decoding unit is connected to the amplitude envelope decoding unit and the bit allocating unit and configured to decode a low bit coding sub-band to obtain a quantization index of the low bit coding sub-band; and decode a high bit coding sub-band to obtain an index vector of the high bit coding sub-band, wherein, the low bit coding sub-band is a coding sub-band in which the number of bits allocated to one frequency domain coefficient is less than a preset threshold value, the high bit coding sub-band is a coding sub-band in which the number of bits allocated to one frequency domain coefficient is greater than or equal to the preset threshold value;

the classification lattice vector quantization inverse quantizing unit is configured to perform inverse quantization of the pyramid lattice vector quantization on the quantization index of the low bit coding sub-band, and perform inverse quantization of the sphere lattice vector quantization on the index vector of the high bit coding sub-band;

the inverse normalization processing unit is configured to perform inverse normalization on values after the inverse quantization has been performed for the coding sub-band, and obtain the frequency domain coefficients;

the noise filling unit is configured to perform noise filling on the sub-band to which no bit is allocated in the frequency domain coefficient output values output by the inverse normalization processing unit;

the inverse modified discrete cosine transform (IMDCT) unit is connected to the noise filling unit and configured to perform IMDCT on the frequency domain coefficient for which the noise filling has been performed to obtain an audio signal.

22. The system according to claim 21, wherein, the bit allocating unit comprises an importance calculating module and a bit allocating module which are connected, and a bit allocation modifying module connected to the bit allocating module, wherein, the importance calculating module is configured to calculate an initial value of importance of each coding sub-band according to an amplitude envelope value of the coding sub-band;

the bit allocating module is configured to perform bit allocation on each frequency domain coefficient in each coding sub-band according to the importance of each coding sub-band, wherein, during the bit allocation, a bit allocation step length and an importance-reduction step length after the bit allocation are both variable;

the bit allocation modifying module is configured to perform the bit allocation modification on the coding sub-band for count times again after performing the bit allocation, according to a value of a number of bit allocation modification iterations count and the importance of each coding sub-band at a coding side.

23. The system according to claim 21, wherein, the frequency domain coefficient decoding unit is configured to, when performing decoding on the low bit coding sub-band, and the number of bits allocated to one frequency domain coefficient of the coding sub-band is 1, if a value of natural binary code of the quantization index is less than "1111 111", then calculate the quantization index according to the value of the natural binary code; if the value of the natural binary code of the quantization index is equal to "1111 111", then continuously read a next bit in, wherein, if the next bit is 0, then the quantization index value is 127, if the next bit is 1, then the quantization index value is 128.

24. The system according to claim 22, wherein, the classification lattice vector quantization inverse quantizing unit comprises a classification processing module and a pyramid lattice vector quantization inverse quantizing module, wherein, the classification processing module is configured to forward the quantization index of the low bit coding sub-band to the pyramid lattice vector quantization inverse quantizing module;

the pyramid lattice vector quantization inverse quantizing module is configured to perform inverse quantization on the quantization index of the low bit coding sub-band; the pyramid lattice vector inverse quantizing module comprises a first lattice point inverse quantizing sub-module and a first energy inverse regulating sub-module which are connected, wherein, the first lattice point inverse quantizing sub-module is configured to determine an energy pyramid surface in which the quantization index of the low bit coding sub-band is located and a label of the quantization index on that energy pyramid surface and further more solve a corresponding $D_8$ lattice point;

the first energy inverse regulating sub-module is configured to perform energy inverse regulation on the solved $D_8$ lattice point Y, and obtain $$\overline{Y}_j^m = (Y+a)/\text{scale(index)}$$

wherein, $a=(2^{-6},2^{-6},2^{-6},2^{-6},2^{-6},2^{-6},2^{-6},2^{-6})$, scale(index) is a scaling factor;

the inverse normalization processing unit is configured to perform inverse normalization processing on $\overline{Y}_j^m$ to obtain the frequency domain coefficient of a $m^{th}$ vector of the coding sub-band j recovered at a decoding side:

$$\overline{X}_j^m = 2^{Th_q(j)/2} \cdot \overline{Y}_j^m$$

wherein, $Th_q(j)$ is an amplitude envelope quantization exponent of the $j^{th}$ coding sub-band.

25. The system according to claim 22, wherein, the classification lattice vector inverse quantizing unit further comprises a sphere lattice vector quantization inverse quantizing module; the classification processing module is further configured to forward the index vector of the high bit coding sub-band to the sphere lattice vector quantization inverse quantizing module to process;

the sphere lattice vector quantization inverse quantizing module is configured to perform inverse quantization on the index vector of the high bit coding sub-band; the sphere lattice vector quantization inverse quantizing module comprises a second lattice point inverse quantizing sub-module and a second energy inverse regulating sub-module which are connected, wherein, the second lattice point inverse quantizing sub-module is configured to solve a $D_8$ lattice point corresponding to the index vector, wherein, the step of solving the $D_8$ lattice point corresponding to the index vector comprises:

calculating $x=k*G$, and calculating ytemp= $x/(2\hat{\,}(\text{region\_bit}(j)))$;

and calculating the $D_8$ lattice point $y=x-f_{D8}(\text{ytemp})*(2\hat{\,}(\text{region\_bit}(j)))$; wherein, k is the index vector of the vector quantization, region_bit(j) represents the number of bits allocated to one frequency domain coefficient in the coding sub-band j; G is a generator matrix of the $D_8$ lattice point and a form of the generator matrix is as follows:

$$G = \begin{bmatrix} 2 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 0 & 0 & 1 & 0 & 0 & 0 & 0 \\ 1 & 0 & 0 & 0 & 1 & 0 & 0 & 0 \\ 1 & 0 & 0 & 0 & 0 & 1 & 0 & 0 \\ 1 & 0 & 0 & 0 & 0 & 0 & 1 & 0 \\ 1 & 0 & 0 & 0 & 0 & 0 & 0 & 1 \end{bmatrix}$$

the second energy inverse regulating sub-module is configured to perform an energy inverse regulation on the solved $D_8$ lattice point, and obtain $$\overline{Y}_j^m = y * \text{scale}(\text{region\_bit}(j))/(2^{\text{region\_bit}(j)}) + a$$

wherein, $a=(2^{-6}, 2^{-6}, 2^{-6}, 2^{-6}, 2^{-6}, 2^{-6}, 2^{-6}, 2^{-6})$, scale(region_bit(j)) is a scaling factor;

the inverse normalization processing unit is configured to perform inverse normalization processing on $\overline{Y}_j^m$ to obtain the frequency domain coefficient of the $m^{th}$ vector of the coding sub-band j recovered at the decoding side:

$$\overline{X}_j^m = 2^{Th_q(j)/2} \cdot \overline{Y}_j^m$$

wherein, $Th_q(j)$ is an amplitude envelope quantization exponent of the $j^{th}$ coding sub-band.

\* \* \* \* \*